United States Patent [19]

Anzai et al.

[11] Patent Number: 4,624,551

[45] Date of Patent: Nov. 25, 1986

[54] LIGHT IRRADIATION CONTROL METHOD FOR PROJECTION EXPOSURE APPARATUS

[75] Inventors: Satoru Anzai, Zama; Masashi Okada, Yotsukaido, both of Japan

[73] Assignee: Nippon Kogaku K.K., Tokyo, Japan

[21] Appl. No.: 793,474

[22] Filed: Oct. 28, 1985

Related U.S. Application Data

[63] Continuation of Ser. No. 651,214, Sep. 14, 1984, abandoned.

[30] Foreign Application Priority Data

Sep. 17, 1983 [JP] Japan .................. 58-171819
Oct. 4, 1983 [JP] Japan .................. 58-184438
Oct. 5, 1983 [JP] Japan .................. 58-186268

[51] Int. Cl.$^4$ .................. G03B 27/42; G03B 27/72
[52] U.S. Cl. .................. 355/53; 355/69; 355/77
[58] Field of Search .................. 355/53, 55, 68, 69, 355/71, 77; 250/205

[56] References Cited

U.S. PATENT DOCUMENTS 4,105,324 8/1978 Seil .................. 355/69 X
4,496,239 1/1985 Isohata et al. .................. 355/53 X Primary Examiner—Michael L. Gellner
Assistant Examiner—D. Rutledge
Attorney, Agent, or Firm—Michael N. Meller

[57] ABSTRACT

A control method for the projection optical system of a projection exposure apparatus used in the fabrication of LSIs. The amount of energy incident to the projection optical system during each unit time is maintained constant at all times including each projection and the intervals between the projection operations. This has the effect of cancelling any error in the projected image, particularly any variation of the magnification error with time due to any variation of the optical performance of the projection optical system caused by the illuminating energy.

20 Claims, 36 Drawing Figures

FIG.1
FIG.2
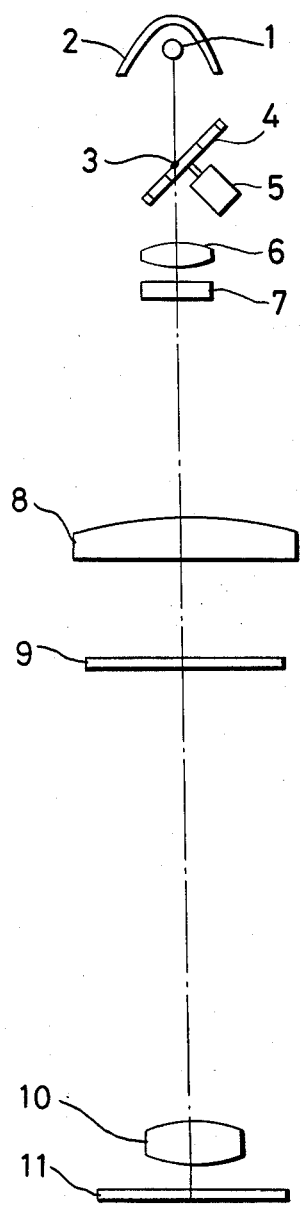
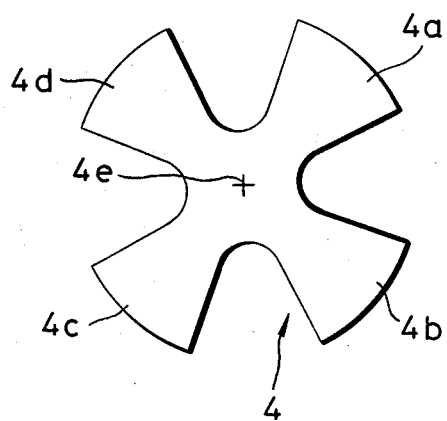

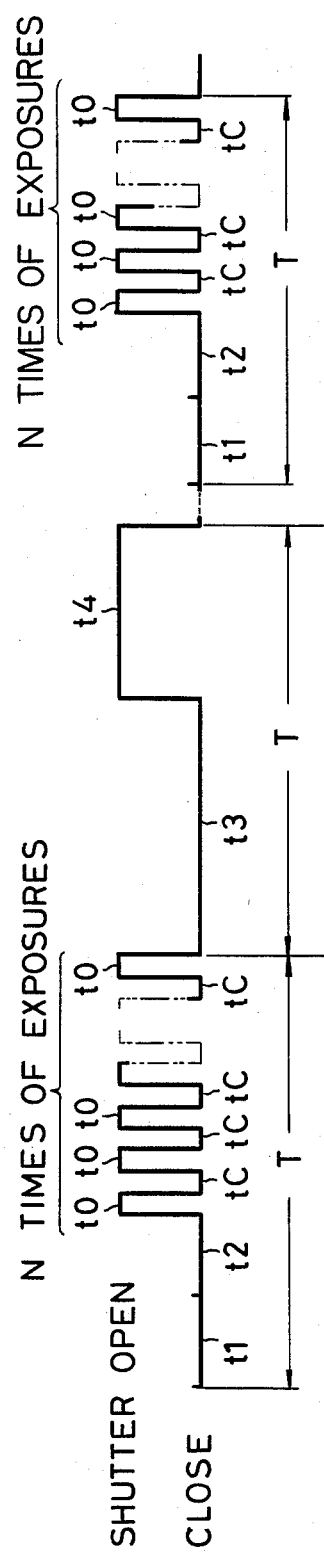
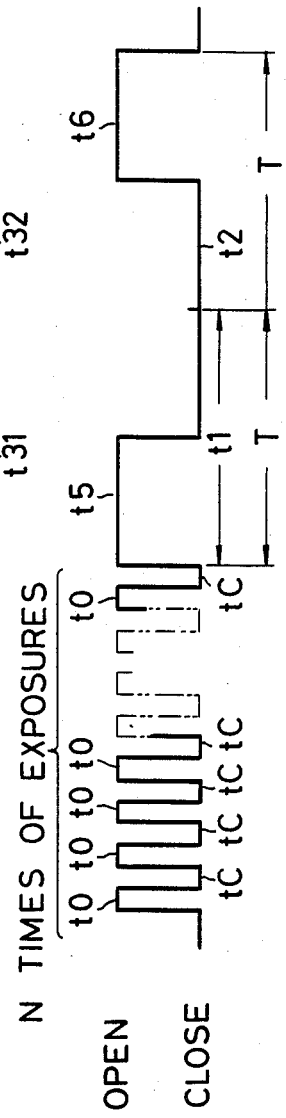
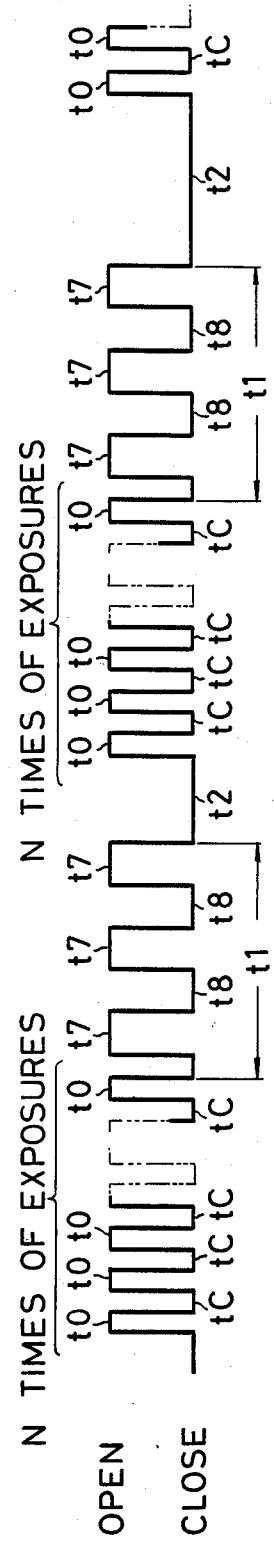
FIG. 3
FIG. 4
FIG. 5

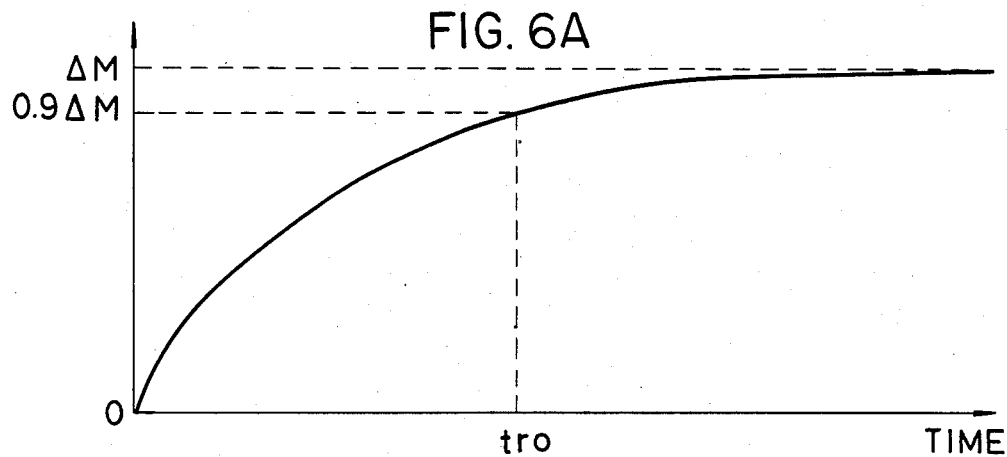
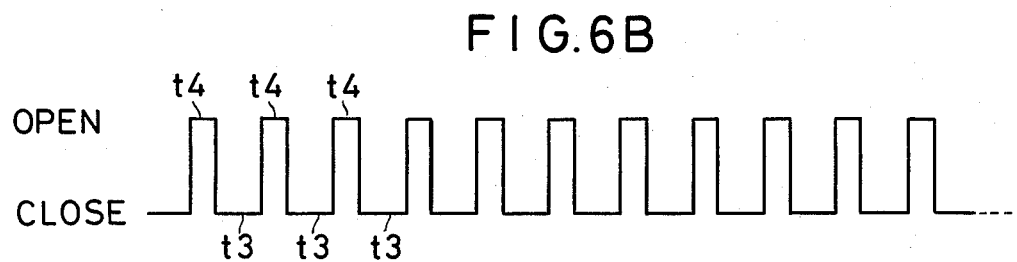
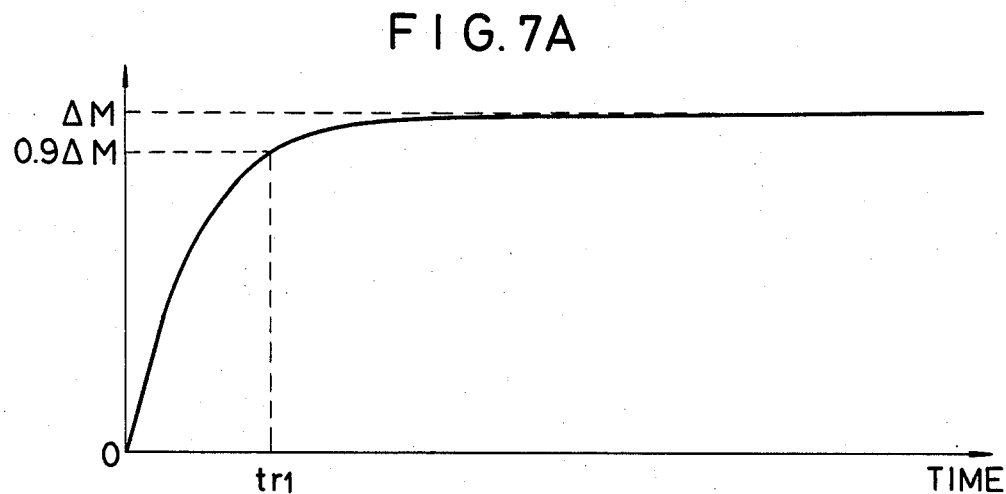
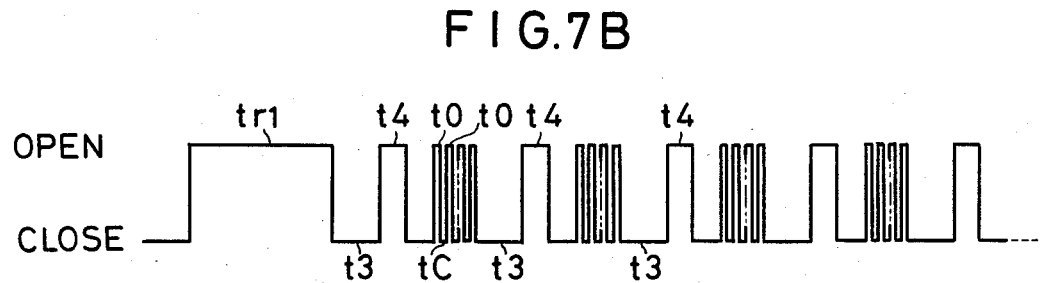

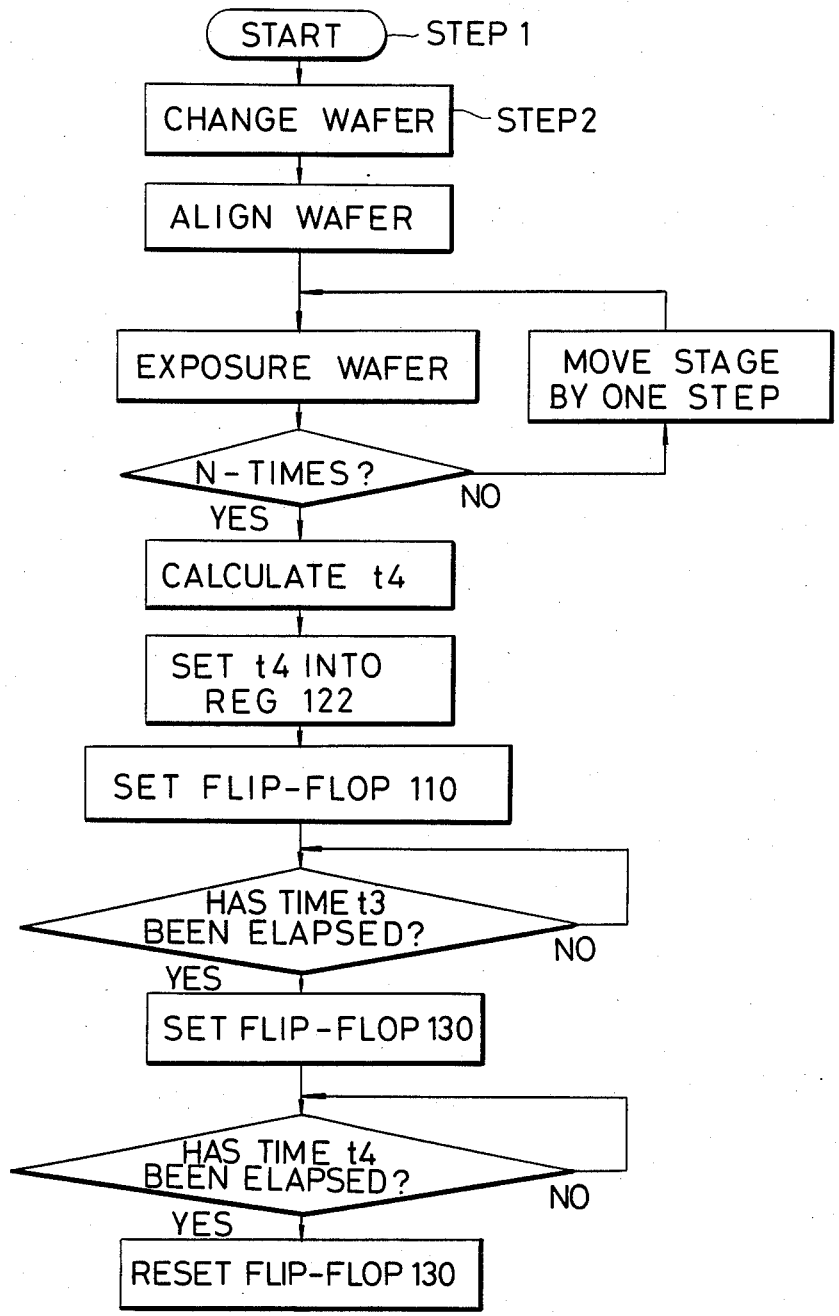

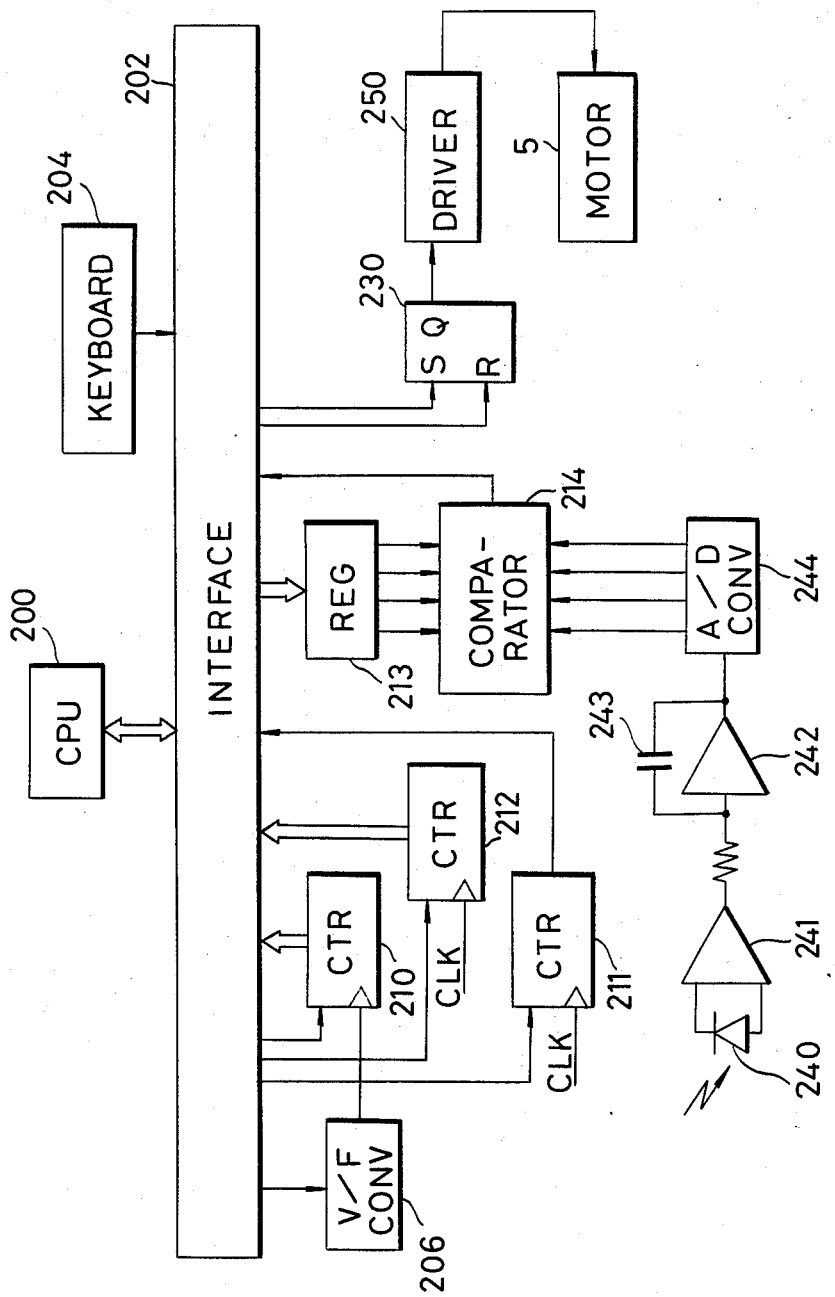

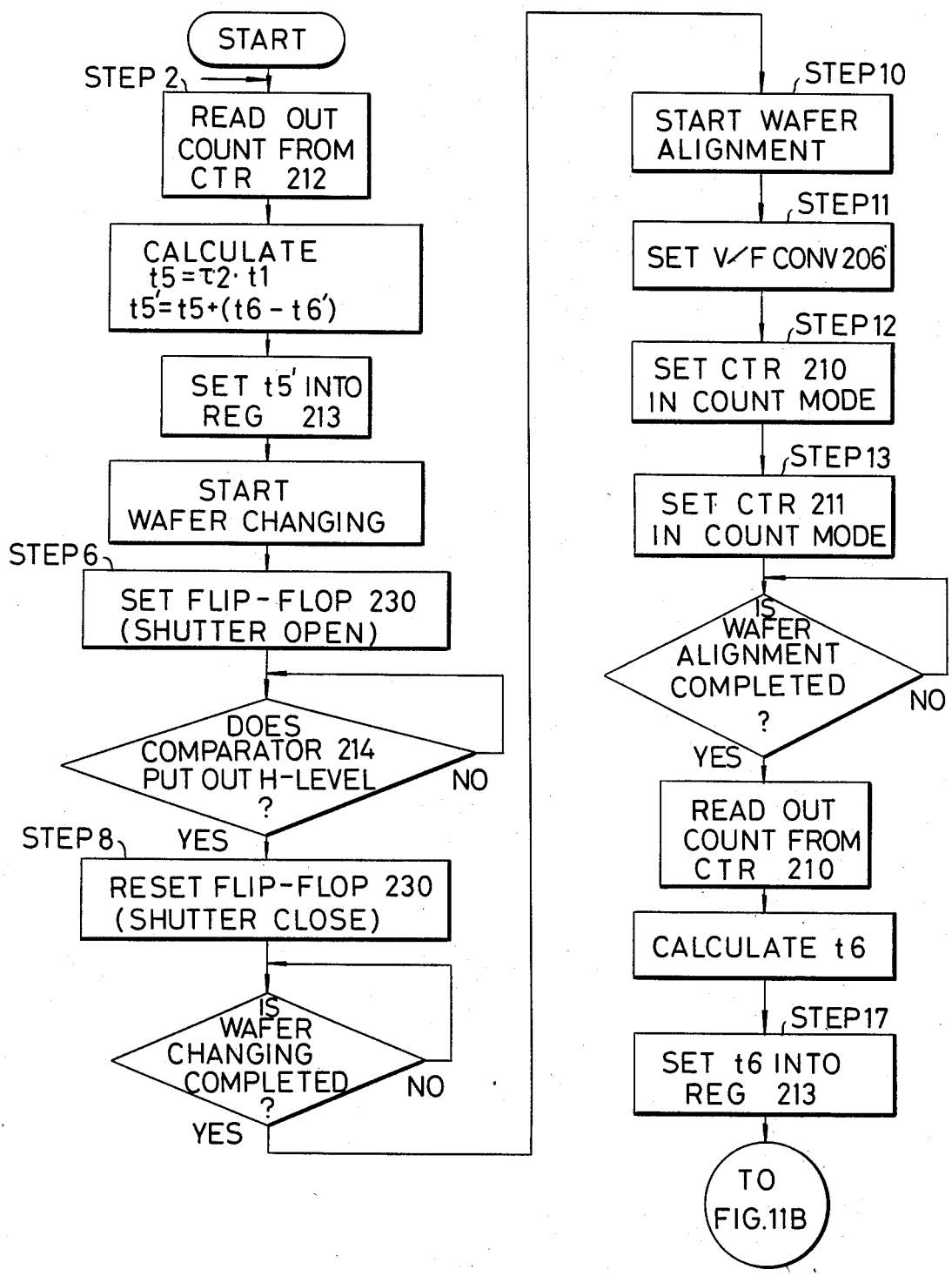

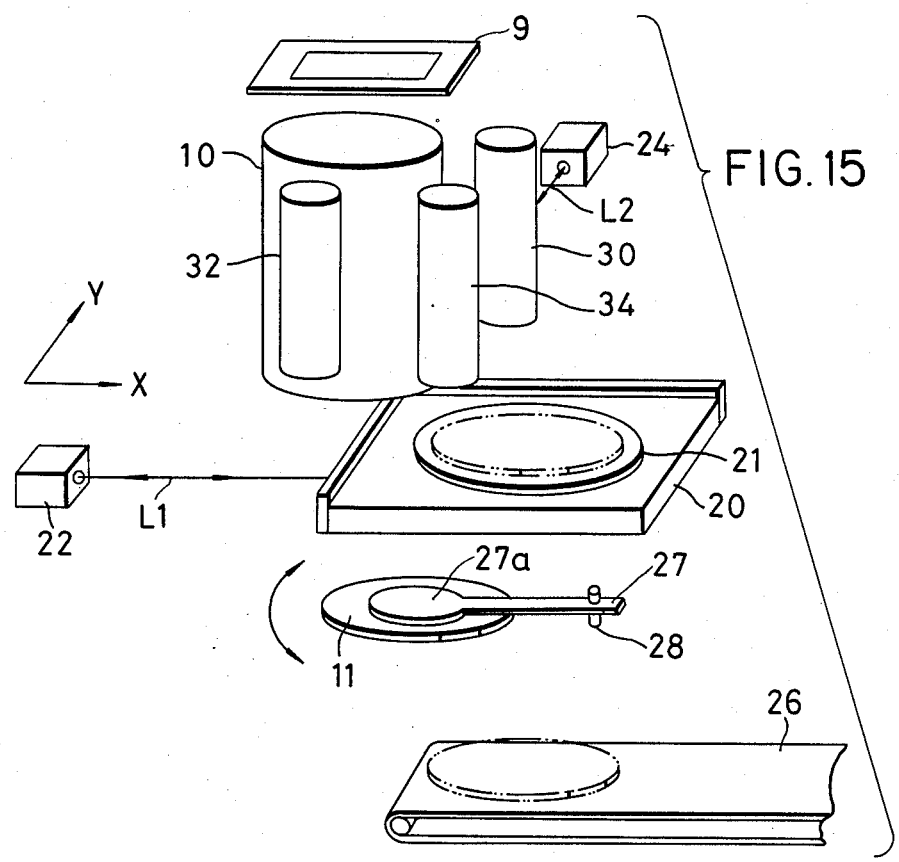
FIG. 15
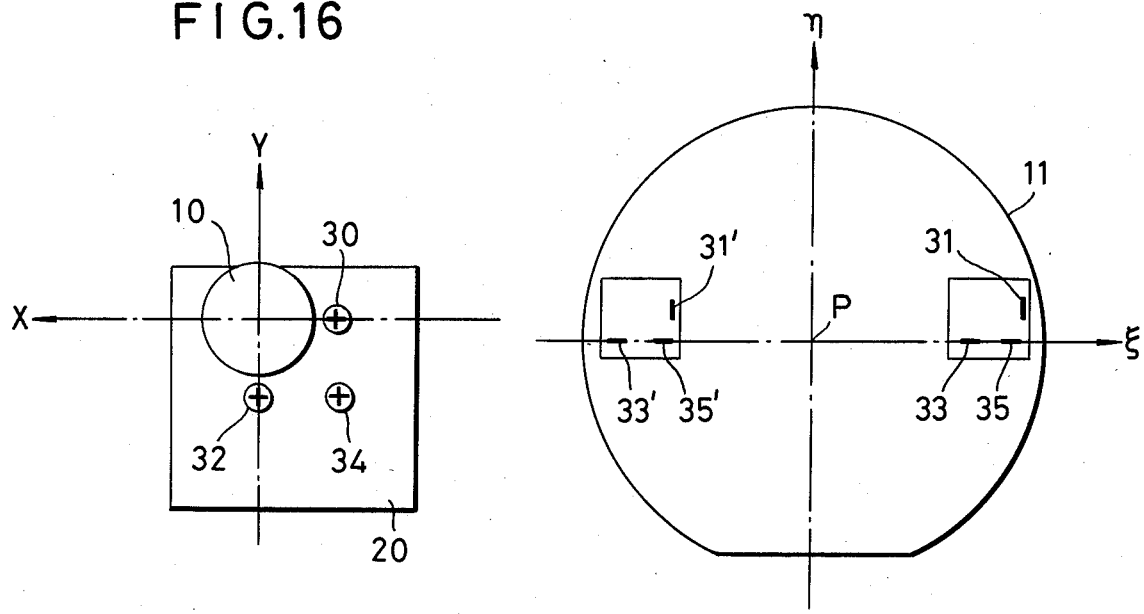
FIG. 16
FIG. 17

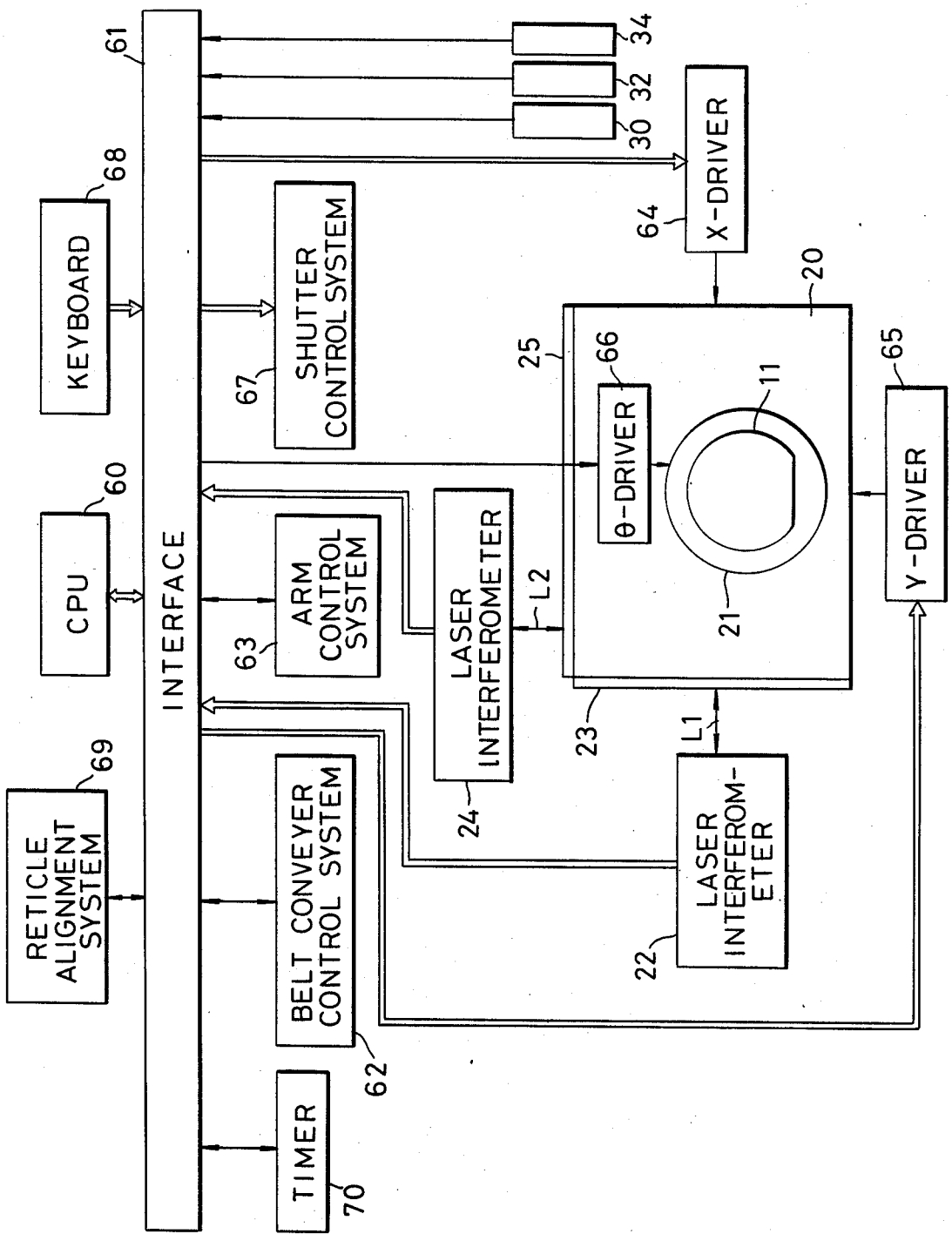

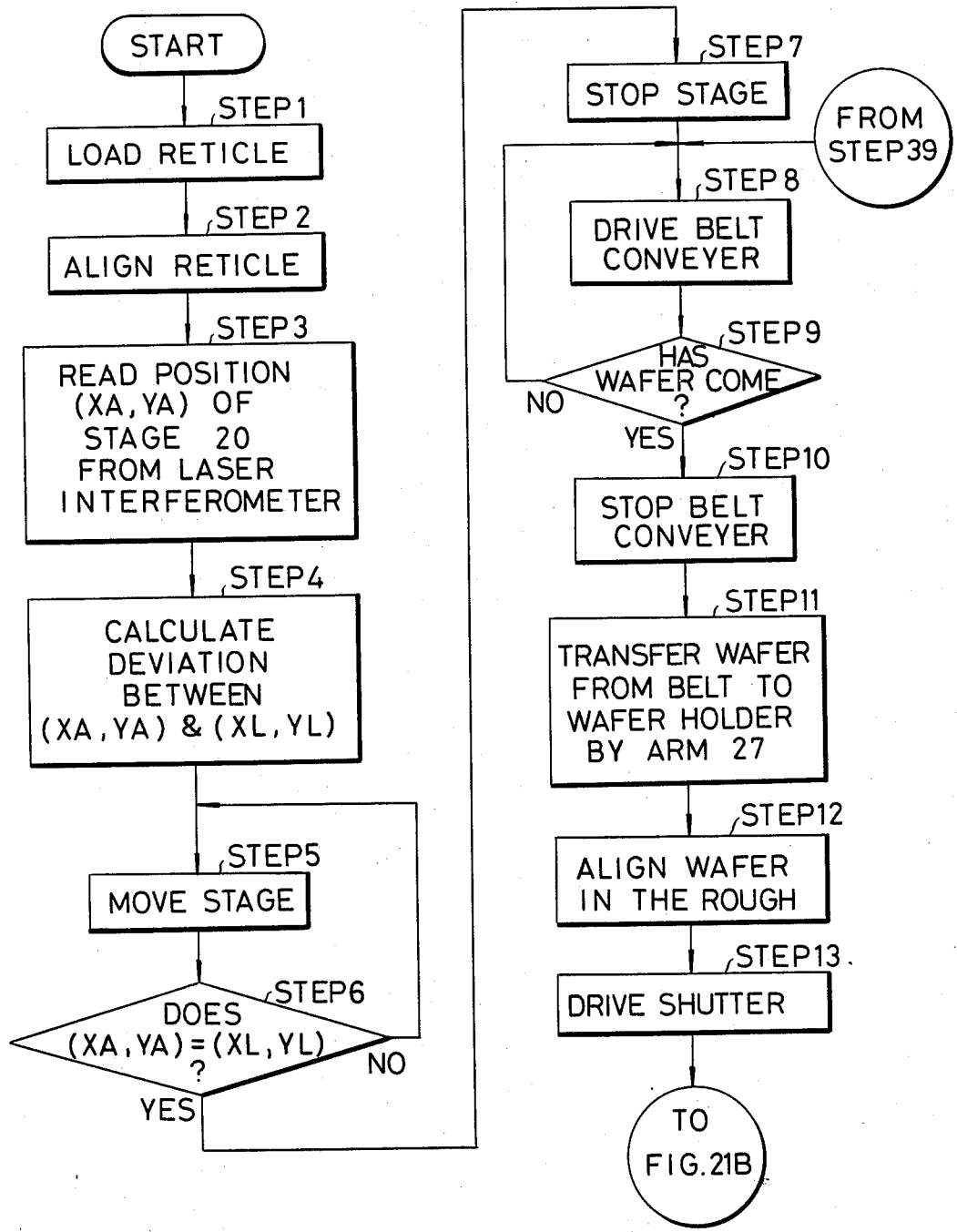

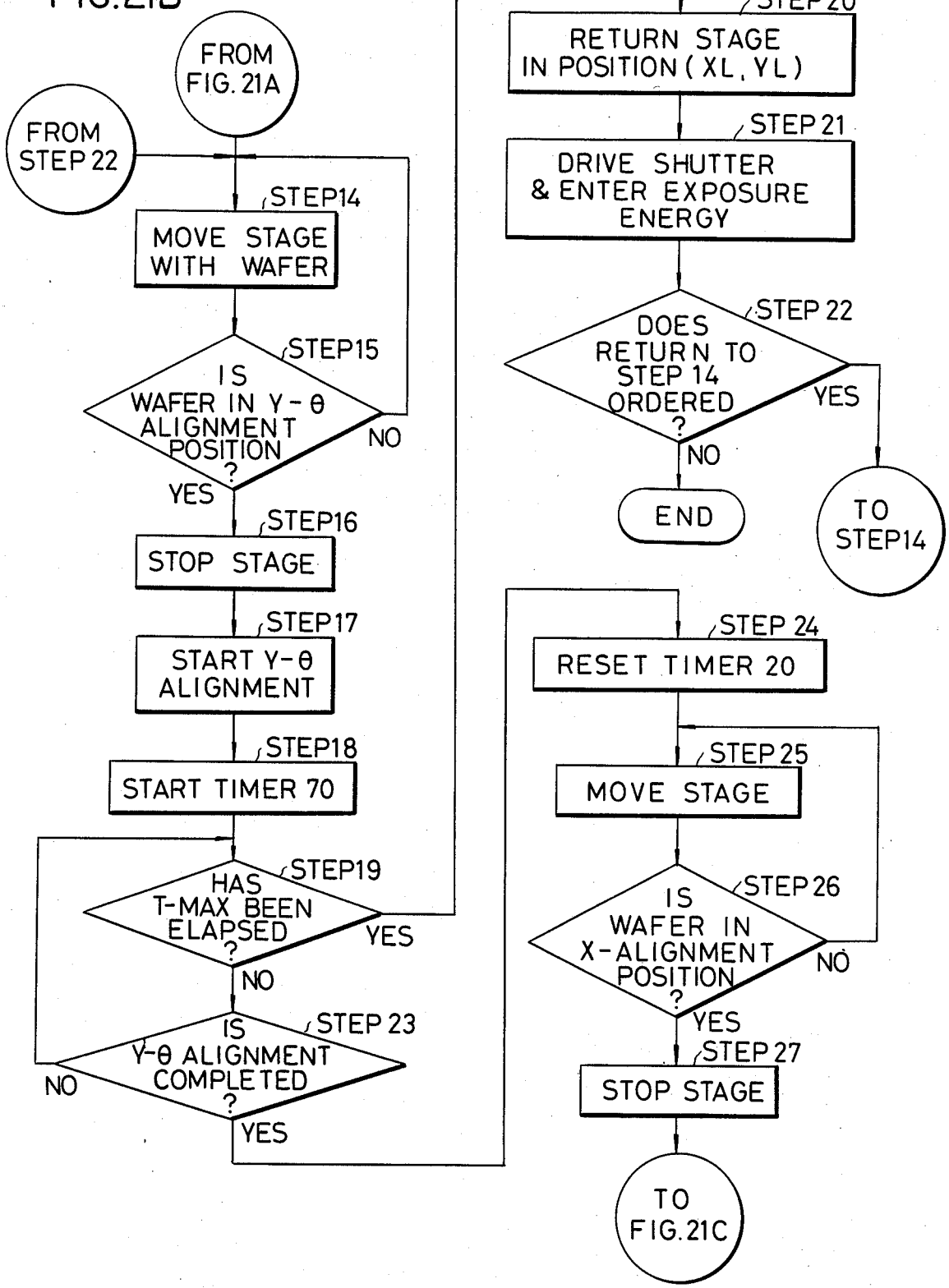

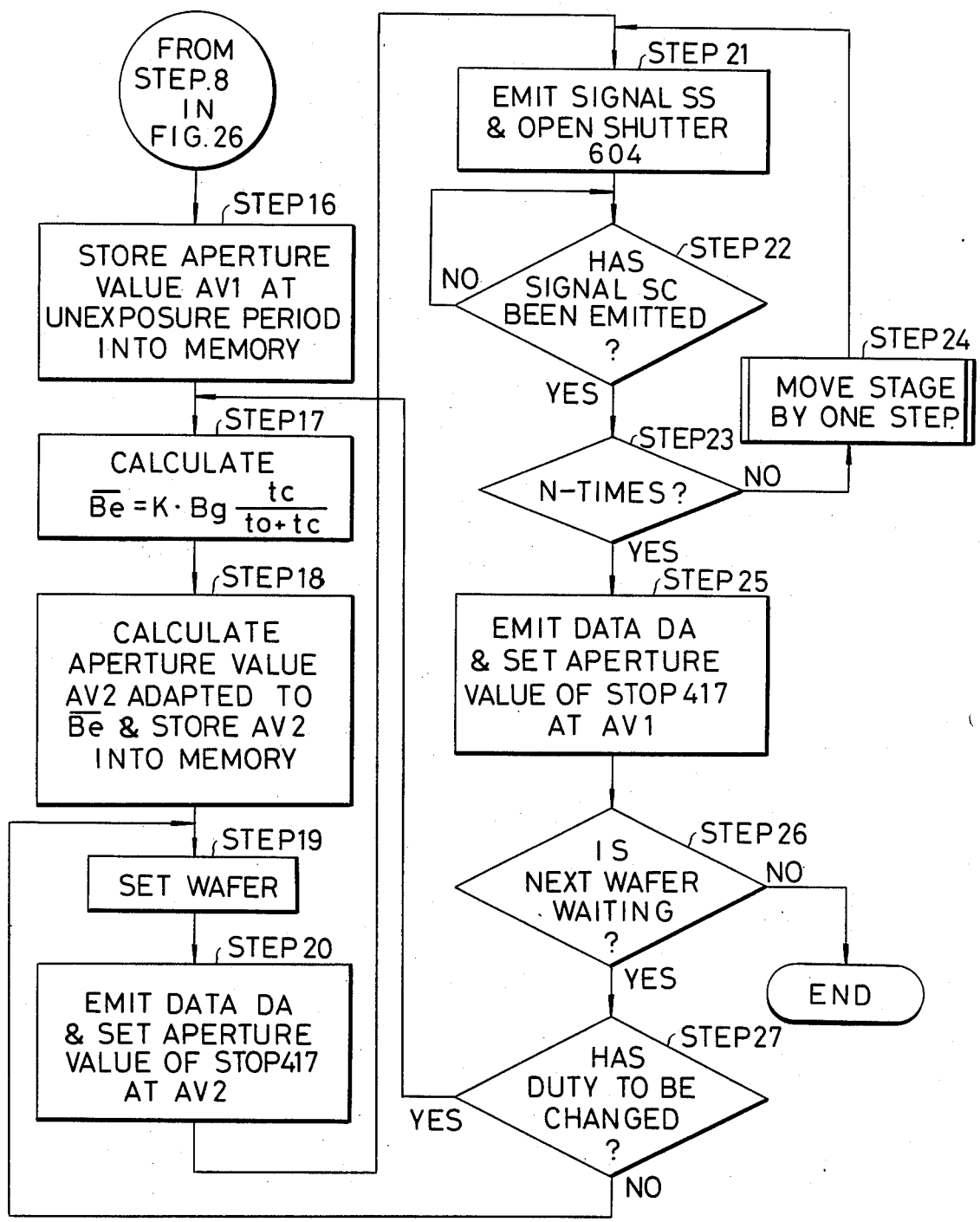

LIGHT IRRADIATION CONTROL METHOD FOR PROJECTION EXPOSURE APPARATUS

This application is a continuation of U.S. patent application Ser. No. 651,214, filed Sept. 14, 1984, abandoned.

BACKGROUND OF THE INVENTION

1. Field of the Invention

The present invention relates to the control of exposure apparatus of the type equipped with a projection optical system and more particularly to an exposure light irradiation control system capable of ensuring a high degree of accuracy for the optical characteristics, e.g., magnification and focal position of such projection optical system.

2. Description of the Prior Art

With projection optical systems heretofore used with projection exposure apparatus adapted for the reduction projection of an image of a circuit pattern on a reticle to a semi-conductor wafer, a severe control is effected on the aberration, magnification, etc., of the optical systems during their manufacture. Particularly in the case of the reduction projection lens system, the exposure area on the wafer is on the order of 22 mm in diameter and the lenses used must be large in diameter so as to meet the required high resolution and large numerical aperture. As a result, the lens barrel itself is also increased in size considerably and the heat capacity is also increased.

In the case of ordinary lenses, no particularly serious problem is presented by any change of the optical characteristics such as the magnification due to the energy of light passed through the lenses.

However, in the manufacturing stage of ICs, particularly VLSIs, recently it has been required to reduce the linewidth of patterns and also a high degreee of accuracy has been required for the registration of patterns upon the wafer over the whole chip surface.

Therefore, if any error occurs in the magnification of the projected image of the next chip pattern to be printed with respect to the chip pattern printed on the wafer, even if an accurate registration is achieved for a part of the chip pattern, the registration accuracy of the other part is deteriorated extremely in accordance with the magnification error.

It is conceived that although differing in dependence on the optical lens arrangement of the projection lens system, such magnification error is caused by the temperature of the lenses themselves, the temperature of air between the lenses or the temperature changes within the lens barrel.

SUMMARY OF THE INVENTION

It is the principal object of the present invention to provide a light irradiation control system designed to compensate for any error of a projected image due to a variation of the optical performance of a projection optical system caused by an illuminating energy.

Thus, the gist of the control method according to the invention consists in always maintaining constant the amount per unit time of incident energy to a projection optical system during the image projection and the intervals between the projection operations and thereby preventing any variation of the error, particularly magnification error, of the projected image with time. Practically, the above-mentioned unit time may be set equal to a period of time which is sufficiently short as compared with the saturation time of the magnification variation. To reduce the unit time tends to correspondingly enhance the magnification accuracy.

In the case of the projection exposure apparatus used in the manufacture of semiconductor devices, although differing with the apparatus, the saturation time is on the order of several to several tens of minutes and it is sufficient to select the unit time to have a value between several tens of seconds and several minutes. Since the above-mentioned system is used after the magnification has been varied by the incident energy and a saturation state has been attained, when bringing into operation again the exposure apparatus which is not in the use condition, a period of time for waiting until the saturation of the magnification is necessary. In order to decrease the waiting time, it is convenient, as a warm-up time, to initially increase the incident energy per unit time as compared to during the use time and thereby cause a magnification error in a short period of time.

While the amount of energy incident to the projection optical system during the unit time is affected by the brightness of a light source, the transmittance of a reticle, the reflectance of a wafer, etc., that which varies most in time is the ratio $\tau$ of that time within the unit time during which the shutter is open and the illuminating light is incident to the projection optical system. Thus, from the magnification error compensating point of view it is most important to maintain the value of $\tau$ constant.

In accordance with a preferred embodiment of the present invention, the light projected to the projection optial system for thermally stabilizing the optical system is different in wavelength from the light used for projected image-forming purposes. In this case, the photosensitive material arranged at the projection plane is sensitive to the wavelength of the projected image-forming light and the photosensitive material is insensitive to light beams of other wavelengths.

BRIEF DESCRIPTION OF THE DRAWINGS

FIG. 1 is a diagram showing the optical arrangement of a projection exposure apparatus according to an embodiment of the invention.

FIG. 2 is a plan view of the rotary shutter in the apparatus of FIG. 1.

FIG. 3 is a time, chart showing the manner in which the illuminating light is controlled according to a first method of the invention.

FIG. 4 is a time chart showing the manner in which the illuminating light is controlled according to a second method of the invention.

FIG. 5 is a time chart showing the manner in which the illuminating light is controlled according to a third method of the invention.

FIGS. 6A and 6B are respectively a graph showing the variation of the projection magnification and a time chart showing manner of controlling the illuminating light.

FIGS. 7A and 7B are respectively a graph showing the variation of the projection magnification and a time chart showing the manner of controlling the illuminating light according to a fourth method of the invention.

FIG. 9 is a flow chart showing the operation of the first embodiment.

FIG. 10 is a circuit block diagram for a second embodiment of the invention.

FIGS. 11A and 11B are flow charts showing the operation of the second embodiment.

FIG. 15 is a schematic diagram showing the mechanical construction of a projection exposure apparatus to which the invention is applied.

FIG. 16 is a schematic plan view showing the arrangement of the projection lens, the stage and the photoelectric microscopes.

FIG. 17 is a diagram for explaining the alignment marks on a wafer.

FIG. 20 is a block diagram of the control system in the projection exposure apparatus.

FIGS. 21A, 21B and 21C are flow charts showing the operation of the control system of FIG. 20.

FIG. 29 is a flow chart showing the operation of a seventh embodiment of the invention.

DESCRIPTION OF THE PREFERRED EMBODIMENTS

Figure 8:
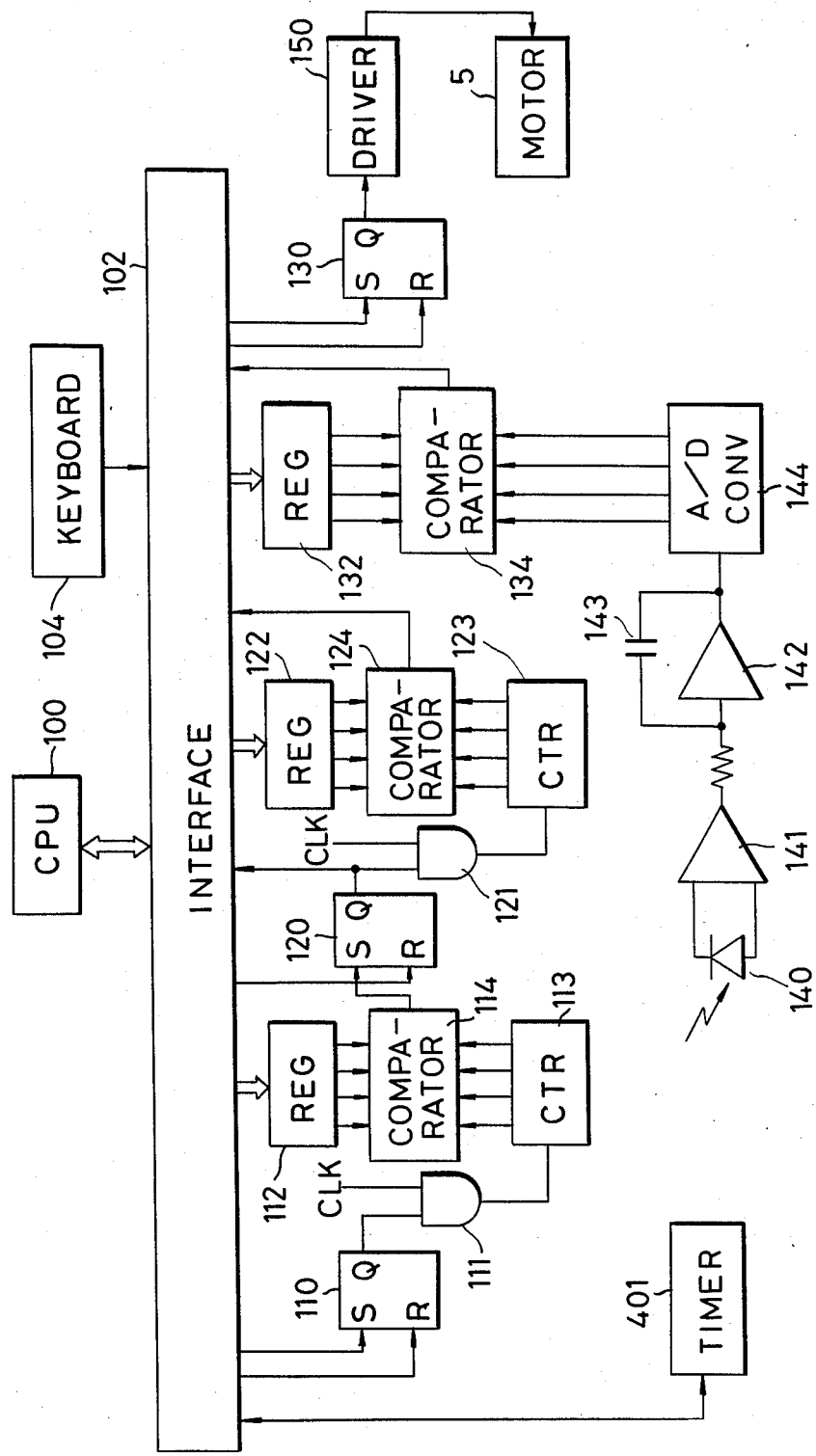
FIG. 8 is a circuit block diagram for a first embodiment of the invention.

FIG. 1 shows an embodiment of a projection exposure apparatus. An exposure light source 1 comprising a very high-pressure mercury-vapor lamp or the like is arranged on the first focal point of an ellipsoidal mirror 2 and the image of the light source 1 is formed on a second focal point 3. A rotary shutter 4 arranged on or near the second focal point 3 includes four radial sectors 4a, 4b, 4c and 4d as shown in FIG. 2. Each of the sectors has a sufficient size for intercepting the light beam from the light source and the notches between the sectors are each of a size sufficient for passing the light beam. The rotary shutter 4 is intermittently rotated about its center of rotation 4e by a motor 5. The light beam from the light source is intercepted when any of the sectors is positioned in the optical path and the removal of the sector from the light path allows the light beam from the light source to fall on a collimator lens 6. The incident light to the collimator lens 6 is converted to a collimated light beam and projected onto an optical integrator 7 composed of a fly eye lens. Then, the optical integrator 7 forms a large number of secondary light source images and illuminates through a condenser lens 8 a reticle or mask 9 forming a projection original. Thus, the light image of the pattern formed on the reticle 9 is formed on a wafer 11 by a projection lens 10. As a result, the pattern of the reticle is printed in the photoresist applied to the wafer 11.

A detailed description will now be made of some embodiments which are based on some basic methods for determining the ratio $\tau$ of the time during which the light beam is incident to the projection optical system during the operation of the exposure apparatus.

The first method is designed as shown in FIG. 3 and it determines the time required for processing a single wafer during the standard operation of the exposure apparatus per unit time T. In accordance with this method, the value of $\tau_1$ or the ratio $\tau$ during the steady-state exposure operation is given by the following equation (1)

$$\tau_1 = \frac{N \cdot t_o}{t_1 + t_2 + N \cdot (t_o + t_c)} \quad (1)$$

where $t_1$ is the time required for changing the wafers, $t_2$ is the wafer alignment time, $t_o$ is the exposure time per shot, $t_c$ is the stepping time and N is the number of exposure shots per wafer. Since the illuminating energy enters the projection optical system during the exposure time or during the time that the shutter is open, the light incident time per wafer is the product of the exposure time $t_o$ and the number of exposed shots or $N \cdot t_o$. As will be seen from equation (1), the unit time T is determined by the wafer changing time $t_1$, the wafer alignment time $t_2$ and the exposure time $t_o$ and the stepping time $t_c$ which are each repeated N times. Where wafers are processed successively, the same operation is always repeated and therefore the value of $\tau_1$ remains unchanged. However, if the wafers are not supplied successively or the apparatus becomes faulty for some reason usually the time elapses with the shutter being closed and thus the value of $\tau_1$ is decreased, thus causing a change in the magnification when the exposure of the wafers is started again. Thus, in order to prevent the value of $\tau_1$ from decreasing, upon stopping the usual exposure operation the shutter is opened at a predetermined ratio and the energy is introduced into the projection optical system.

Thus, in order to maintain the value of $\tau_1$ in the equation (1), it is only necessary to operate the shutter in the following manner. In other words, assuming that $t_3$ represents the time required to determine that the apparatus has stopped its steady-state exposure operation and $t_4$ represents the time that the shutter is opened to prevent the value of $\tau_1$ from decreasing, then $\tau_1 = t_4/(t_3+t_4)$ and therefore the shutter is operated so as to satisfy the following equation $$t_4 = t_1 \cdot t_3 / (1 - \tau_1) \quad (2)$$

Therefore, it is only necessary to operate the shutter so that after the shutter has been closed in excess of the time $t_3$ the shutter is opened for the time $t_4$ given by the equation (2).

While the accuracy is improved with a decrease in the length of the time $t_3 + t_4$ as mentioned previously, no difficulty will be caused if the time is held less than the time for processing a single wafer, that is, the denominator $$t_1 + t_2 + N \cdot (t_o + t_c)$$

of the equation (1). If the steady-state exposure operation is not restored even after the expiration of the time $(t_3+t_4)$, it is possible to prevent the decreases of $\tau_1$ by repeating the time $(t_3+t_4)$ a plurality of times. In this embodiment, the calculation of $t_3$, $t_4$ and $\tau_1$ and a determination of stopping of the steady-state operation can be made by electronic circuits or alternatively the operator may make the determination and then indicate and input the respective values. Also, it is needless to say that $\tau_1 = t_4/(t_3+t_4)$ is the term to be controlled and therefore each of $t_3$ and $t_4$ may be divided into i parts to obtain the same effect. The chart shown in the lower part of FIG. 3 represents the case where the values are each divided into two parts. In other words, if $t_{3i}$ represents the shutter closed time and $t_{4i}$ represents the shutter open time for each divided portion, then it is only necessary to satisfy the following $$\tau_1 = \frac{\Sigma t_{4i}}{\Sigma t_{3i} + \Sigma t_{4i}}$$

The value of the denominator is equal to the unit time T.

Then, the alignment marks formed on the wafer for alignment purposes have also been made through an exposure operation and a developing operation and thus the alignment time is varied depending on the quality of the marks. Since the shutter cannot be opened during the alignment, a variation of the alignment time causes a variation of the value $\tau_1$. Thus, the time $t_4$ must be varied in accordance with the value of $t_2$ or $t_1+t_2+N(t_o+t_c)$.

The second method is designed as shown in FIG. 4 and the method utilizes as the unit time T a time which is shorter than the time required for processing a single wafer, that is, a wafer changing time which is shorter than the step and repeat time per wafer. In this case, the ratio $\tau$ in the step and repeat time or a value $\tau_2$ in this method is given by the following equation (3)

$$\tau_2 = \frac{t_o}{t_o + t_c} \quad (3)$$

If the shutter is closed during the time $t_1$ required for changing the wafers and the time $t_2$ required for making the wafer alignment, the value $\tau_2$ is decreased and this method is designed to prevent this decreases. Firstly, the shutter is opened during a time $t_5$ of the wafer changing time $t_1$ which is given by the following equation (4)

$$t_5 = \tau_2 \cdot t_1 \quad (4)$$

In other words, the shutter is opened for the time $t_5(<t_1)$ and closed for the time $(t_1-t_5)$. Then, if the shutter is opened during the wafer alignment time t, the photoresist on the wafer in the course of alignment is exposed. Thus, a time $t_6$ is separately provided after the lapse of the wafer alignment time and the time $t_6$ is given by the following equation (5)

$$t_6 = \tau_2 \cdot t_2(1-\tau_2) \quad (5)$$

Then, the time $(t_2+t_6)$ is selected to be no greater than the unit time T.

Then, if the wafer alignment time is increased so that $(t_2+t_3)>T$, time $t_6$ must be made smaller than the time given by the equation (5) so as to prevent the throughput from decreasing. Thus, in such a case, upon the next wafer changing the incident energy must be supplemented to cause the projection lens to approach a saturation state. In other words, the length of the time $t_5$ within the next wafer changing must be corrected. The reason is that during the step and repeat operation the energy of the illuminating light incident per unit time to the projection lens is constant and consequently the projection lens becomes unsaturated as the result of the increased wafer alignment time.

The third method is represented by the time chart shown in FIG. 5. In order to correct the magnification variation with a high degree of accuracy, it is essential that the ratio $\tau$ for the steady-state exposure operation be kept completely during operation than the exposure operation. Thus, it is conceivable to intermittently open and close the shutter in the like manner as during the step and repeat operation except cases where there is the possibility of the photoresist applied to the wafer being exposed to the illuminating light incident to the projection lens. A time $t_7$ is the time that the shutter is open and a time $t_8$ is the time the shutter is closed. In this case, is also necessary that when the wafer alignment time is increased, the ratio between the times $t_7$ and $t_8$ is changed correspondingly and the projection lens is brought back into the saturation state.

The fourth method will be described with reference to FIGS. 6 and 7. When the illuminating light is not incident to the projection lens for a long period of time, the lens is cold. Then, the illuminating light is repeatedly projected to the projection lens by the shutter opening and closing operations for the times $t_3$ and $t_4$ shown in FIG. 3 and the lens is brought from the cold condition to a condition where the magnification variation of the lens is saturated. In this case, if $\Delta M$ represents the value of the magnification variation at the saturation state from the start of projection of the illuminating light, then a time $t_{ro}$ is required to attain 0.9 $\Delta M$, for example, as shown by the curve of FIG. 6A. The time $t_{ro}$ is usually greater than 30 minutes and thus there is a disadvantage that it is necessary to wait a long period of time from the start of the shutter opening and closing before the step and repeat operation is started. FIG. 6B shows the manner in which the shutter is opened and closed.

Thus, in order to reduce the time $t_{ro}$, the shutter is first opened for a time $t_{r1}(t_{r1}>t_4)$ and then after the unit time T has been established, the shutter is closed for the time $t_3$ and then opened for the time $t_4$ as shown in FIG. 7B. By so doing, the step and repeat operation can be started after a short period of waiting time. FIG. 7A shows the relation between the time (t) and the magnification variation ($\Delta M$) in such a condition. In this case, the time $t_{r1}$ required for the magnification variation value to reach 0.9 $\Delta M$ is dependent on the thermal time characteristic of the projection lens. If the intensity of the exposure light incident to the projection lens upon opening of the shutter is not varied with time, the time $t_{r1}$ is kept substantially constant even if the ratio between the light shielding portion and the light passing portion of the reticle or the brightness of the light source is varied.

FIG. 8 shows an embodiment of an apparatus for performing the method shown in FIG. 3. A central processing unit or CPU 100 reads through an interface 102 a wafer changing time $t_1$, a wafer alignment time $t_2$, a stepping time $t_c$ and an exposure time $t_o$ upon the processing of each wafer. It is to be noted that if the sensitivity of the photoresist applied to the wafers and the stepping speed of the stage are constant, the step and repeat time is also constant and thus it may be preliminarily stored in the memory of the CPU 100 through a keyboard 104. A register 112 is provided to preset a time $t_3$ and it stores a numerical value input by the keyboard 104 through the interface 102. A flip-flop 110 is set to generate an H level output at its output terminal when the step and repeat operation is completed (when N exposures are completed for each wafer) and it is reset to generate an L level output at the output terminal Q when the wafer changing is started. An AND gate 111 receives the output from the output terminal Q of the flip-flop 110 at its one input and clock pulses CLK of a fixed frequency at its other input. A counter 113 counts the clock pulses from the AND gate 111. A comparator 114 compares the contents of the register 112 and the counter 113 and generates an H level output when their contents are equal. A flip-flop 120 is set by the H output of the comparator 114 to generate an H level output at its terminal Q and it is reset to generate an L level output when the wafer changing is started. The H output of the flip-flop 120 is read as a signal indicating the lapse of the time $t_3$ into the CPU 100. An AND gate 121 receives the output from the terminal Q of the flip-flop 120 at its one input and the clock pulses CLK at its other input. A counter 123 counts the clock pulses from the AND gate 121. A register 122 is provided to preset a shutter open time $t_4$. A comparator 124 generates an H level output when the contents of the register 122 and the counter 123 become equal to each other. The H output from the comparator 124 is read as a signal indicating the lapse of the time $t_4$ into the CPU 100.

A register 132 is provided to preset exposure data corresponding to the light quantities for providing the proper exposure light quantity to the photoresist applied to the wafers. A photodiode 140 receives the light from the light source 1 during the time that the rotary shutter 4 is open. The output of the photodiode 140 is amplified by a head amplifier 141 and applied to an integrator circuit. The integrator circuit includes an amplifier 142 and a capacitor 143 and its integrated light output for the interval between the opening and closing of the shutter is converted to a digital value by an A/D converter 144. A comparator 134 compares the preset value of the register 132 and the integrated output of the A/D converter 144 and generates an H level output when the two become equal to each other. The H output of the comparator 134 is read as an end of wafer exposure signal into the CPU 100. When a flip-flop 130 is set, an H level output is generated at its terminal Q and a motor driver circuit 150 is operated. When the flip-flop 130 is reset, an L level output is generated at the terminal Q and the driver circuit 150 is brought out of operation. The setting and resetting of the flip-flop 130 are commanded by the CPU 100 through the interface 102. Also, the driver circuit 150 opens the rotary shutter 4 through the motor 5 when the flip-flop 130 is set and it closes the rotary shutter 4 when the flip-flop 130 is reset. When the step and repeat operation is completed, the CPU 100 calculates the time $t_4$ from the equation (2) and stores it in the register 122.

The operation of the apparatus will now be described with reference to the flow chart of FIG. 9. An operation start signal for the exposure apparatus is inputted first by the keyboard 104. Thus, the wafer change and the wafer alignment are effected. When these are completed, the step and repeat operation of exposing the wafer according to the exposure data stored in the register 132 and the integrated light output of the A/D converter 144 and then moving the stage by one step is repeated N times. In this interval, the flip-flop 130 is first set in response to the completion of the wafer alignment, reset by the H output of the comparator 134 upon the completion of the exposure of the desired light quantity and again set in response to the completion of the stepping movement of the stage. Thereafter, the flip-flop 130 is set and reset repeatedly in response to the completion of the stepping movement of the stage until the completion of N exposures.

When the N exposures are completed, the CPU 100 calculates the value of $t_1+t_2+N\cdot(t_o+t_c)$ and then calculates the time $t_4$ according to the equation (2). Then, the CPU 100 stores the time $t_4$ in the register 122 and the flip-flop 110 is set. When the flip-flop 110 is set, the counter 113 counts the clock pulses applied from the AND gate 111. The comparator 114 sets the flip-flop 120 when the count of the counter 113 coincides with the content of the register 112. When this occurs, an H level output is generated from the terminal Q of the flip-flop 120 and the output is read as a signal indicating the lapse of the time $t_3$ into the CPU 100.

When this occurs, the flip-flop 130 is set and the shutter is opened. This condition is maintained until the time $t_4$ expires. When the time $t_4$ expires, the flip-flop 130 is reset and the shutter is closed.

In accordance with this embodiment, each time a wafer is processed, the value of $t_1+t_2+N\cdot(t_o+t_c)$ is calculated and on the basis of the result, the time $t_4$ is calculated from the equation (2), thereby maintaining the ratio $\tau_1$ constant even if the wafer alignment time is varied.

FIG. 10 shows an embodiment of an apparatus for performing the method shown in FIG. 4. A voltage-frequency converter 206 generates a pulse of a frequency corresponding to the voltage applied from an interface 202. The output pulses from the converter 206 are applied as count pulses to a counter 210.

A unit time counting counter 211 receives clock pulses CLK of a predetermined frequency as its count pulses so that it starts counting in response to the start of the wafer alignment and it generates an H level output in response to the counting of the unit time T. A counter 212 is provided to start counting the clock pulses upon the completion of the wafer alignment and the count attained during the interval between the start of the wafer alignment and the lapse of the unit time T is read into a CPU 200.

A register 213 is provided to store a wafer exposure time $t_o$ or exposure times $t_5$ and $t_6$ (the times during which the exposure wavelength energy is projected to the projection lens but the wafer is not exposed). It is assumed that the times $t_5$ and $t_6$ are converted to exposure values and stored in the register 213. A photodiode 240, amplifiers 241 and 242, a capacitor 243 and an A/D converter 244 form a light quantity integrating circuit as in the case of FIG. 8. A comparator 214 generates an H level output when the preset value of the register 213 and the output of the A/D converter 244 become equal to each other. A flip-flop 230 generates an H level output at its terminal Q in response to the application of an exposure start command to its set terminal S and generates an L level output at the terminal Q in response to the application of an exposure ending command to its reset terminal R. In the like manner as its counterpart of FIG. 8, a motor driver circuit 250 is responsive to the H level at the terminal Q of the flip-flop 230 to rotate the motor 5 a predetermined angle and open the shutter 4 and responsive to the low level at the terminal Q to again rotate the motor 5 the predetermined angle and close the shutter 4.

The CPU 200 is connected to the voltage-frequency converter 206, the counters 210, 211 and 212, the register 213 and the flip-flop 230 through the interface 202 and it controls them in the below-mentioned manner. A keyboard 204 enters the required commands and data into the CPU 200 through the interface 202.

Figure 11B:
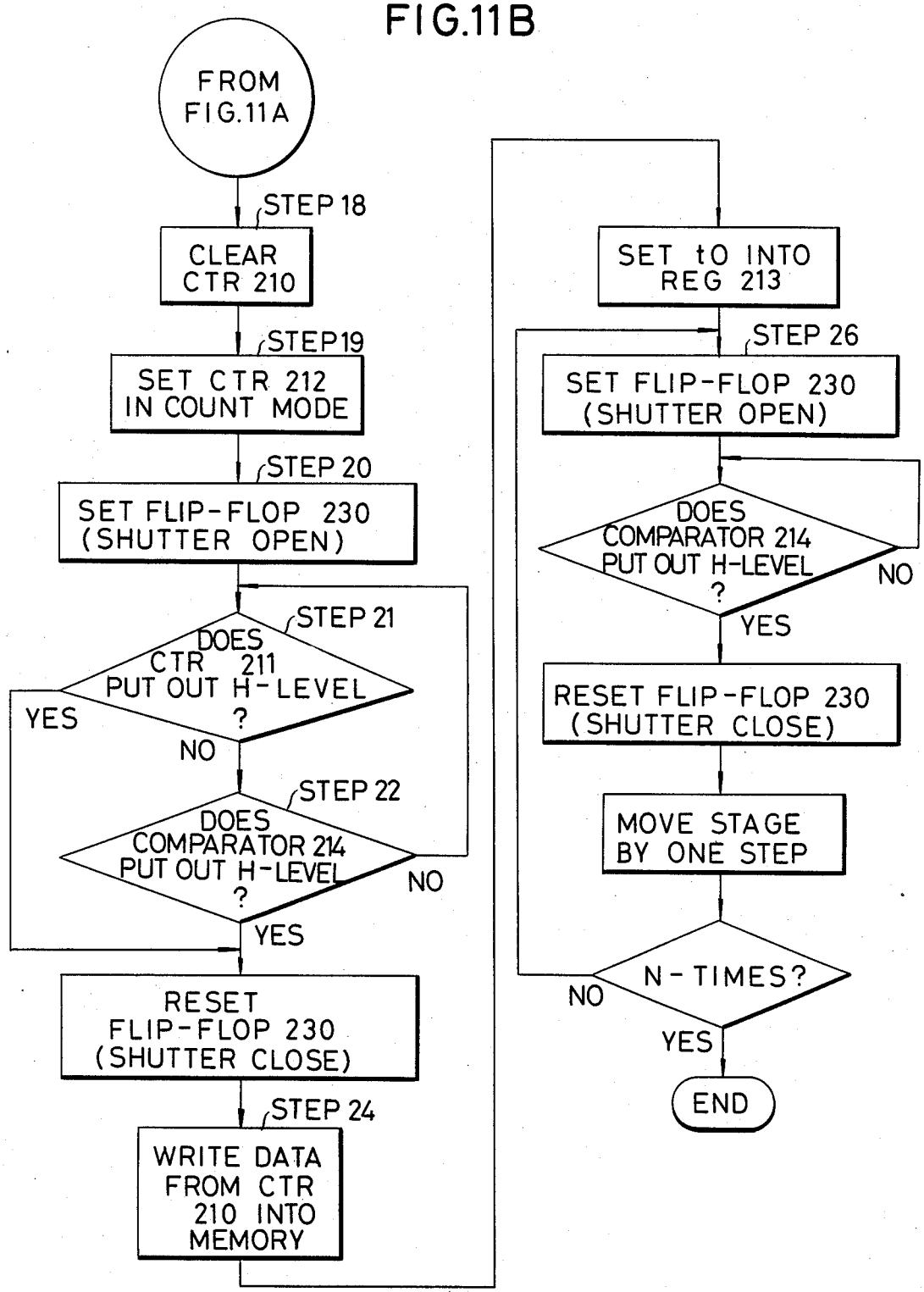

The operation of this embodiment will now be described with reference to the flow charts of FIGS. 11A and 11B. When the start of the operation is commanded by the keyboard 204, the CPU 200 reads the count of the counter 212 from the memory (incorporated in the CPU) at a step 2. Here, the count of the counter 212 is used for the purpose of calculating the difference between the computed exposure time $t_6$ calculated from the equation (5) and the actual exposure time $t_{6'}$ during the unit time T. Then, the CPU 200 calculates the time $t_5$ in accordance with the equation (4). In this case, the time corresponding to the count of the counter 212 read from the memory is added to the time $t_5$. Then, the resulting time $t_{5'} = t_5 + (t_6 - t_{6'})$ is stored in the register 213. The reason for calculating the time $t_{5'}$ will be described later. Then, a wafer changing start command is sent to wafer changing means (not shown) so that a wafer is supplied to the exposure apparatus and the H output or the exposure start command is applied to the set terminal S of the flip-flop 230, that is, an exposure start command is applied at a step 6. As a result, the terminal Q of the flip-flop 230 goes to the H level so that the motor driver circuit 250 is operated and the rotary shutter 4 is opened. When the shutter 4 is opened, the photodiode 240 receives the exposure light and it starts integrating the light quantity. Then, when the output of the A/D converter 244 becomes equal to the preset value of the register 213, the comparator 214 generates an H level output. The H output of the comparator 214 is an indication that the time $t_5$ has elapsed since the start of the exposure. Since the CPU 200 has been monitoring the comparator 214 for the generation of the H output since the start of the exposure, when the H output is generated from the comparator 214, a transfer is made to a step 8 where the H output or the exposure ending command is applied to the terminal R of the flip-flop 230. Thus, the motor driver circuit 250 closes the shutter.

Also, the CPU 200 monitors for the completion of the wafer changing so that when the supply of the wafer to the exposure apparatus is completed, the wafer alignment is started at a step 10. Simultaneously with the commanding of the start of the wafer aligning operation, the CPU 200 sets the frequency of the output pulses from the voltage-frequency converter 206 to one corresponding to $\tau_2/(1-\tau_2)$ in the equation (5) and the counter 210 is placed in the counting mode of operation. Thus, the counter 210 counts the output pulses of the voltage-frequency converter 206 starting at the wafer alignment starting point. Also, the CPU 200 places the counter 211 in the counting mode at the start of the aligning operation and the counter 211 counts the clock pulses. The steps 10 to 13 are performed almost simultaneously. The CPU 200 monitors for the completion of the wafer alignment so that when the wafer alignment is completed, the CPU 200 reads in the count of the counter 210 and stores it in the memory (incorporated in the CPU).

Since the pulses generated from the converter 206 at the frequency corresponding to $\tau_2/(1-\tau_2)$ are counted by the counter 210 for the duration of the wafer alignment time $t_2$, the count read corresponds to the time $t_6$. The CPU 200 calculates the time $t_6$ from the count of the counter 210 and stores it in the register 213. Then, the count of the counter 210 is cleared and the counter 212 is placed in the counting mode. Then, the H output is applied to the terminal S of the flip-flop 230 and the shutter is opened. The steps 17 to 19 are performed almost simultaneously.

When the shutter is opened, the CPU 200 monitors the output of the counter 211 and the output of the comparator 214. Then, when the counter 211 counts the unit time T and generates an H level output, irrespective of whether the H output is generated from the comparator 214, the H level output is applied to the terminal R of the flip-flop 230 and the shutter is closed.

On the other hand, when the comparator 214 generates an H level output prior to the generation of an H level output from the counter 211, an H level output is applied to the terminal R of the flip-flop 230 by the output of the comparator 214 and the shutter is closed. Steps 21 and 22 control so that the shutter is open only during the interval between the time that the wafer alignment is started and the time that the unit time T expires. When the flip-flop 230 is reset, the CPU 200 stores the count of the counter 212 in the memory. The count of the counter 212 at the step 24 corresponds in fact to the time $t_{6'}$ during which the shutter is open.

Then, in order to expose the photoresist applied to the wafer to the exposure light wavelength, the CPU 200 stores the exposure value data corresponding to the time $t_o$ in the register 213. At the following step 26, the flip-flop 230 is set and the shutter is opened. The comparator 214 is monitored for the generation of an H output. When the comparator 214 generates an H output, the flip-flop 230 is reset and the shutter is closed. Then, the stage carrying the wafer thereon is moved by one step. When the step and repeat operation has been repeated N times, a return is made to the step 2 and similar operations are repeated for the wafer supplied next. When the processing of a predetermined number of wafers is completed, the operation of the apparatus is ended. It is assumed that during the interval between the times $t_5$ and $t_6$ in FIG. 4, the stage is removed to a position where there is no danger of the wafer being exposed (e.g., a position where the wafer is not exposed to the exposure wavelength light passed through the projection lens).

As described hereinabove, the difference between the computed exposure time $t_6$ and the actual exposure time $t_{6'}$ relating to the preceding wafer in time sequence is reflected in the exposure time $t_5$ relating to the following wafer in time sequence. In other words, even in the case of $t_6 > t_{6'}$ during the following wafer changing the time $t_5$ is varied in accordance with the difference, thus making it possible to maintain the projection lens in the saturated state.

Figure 12:
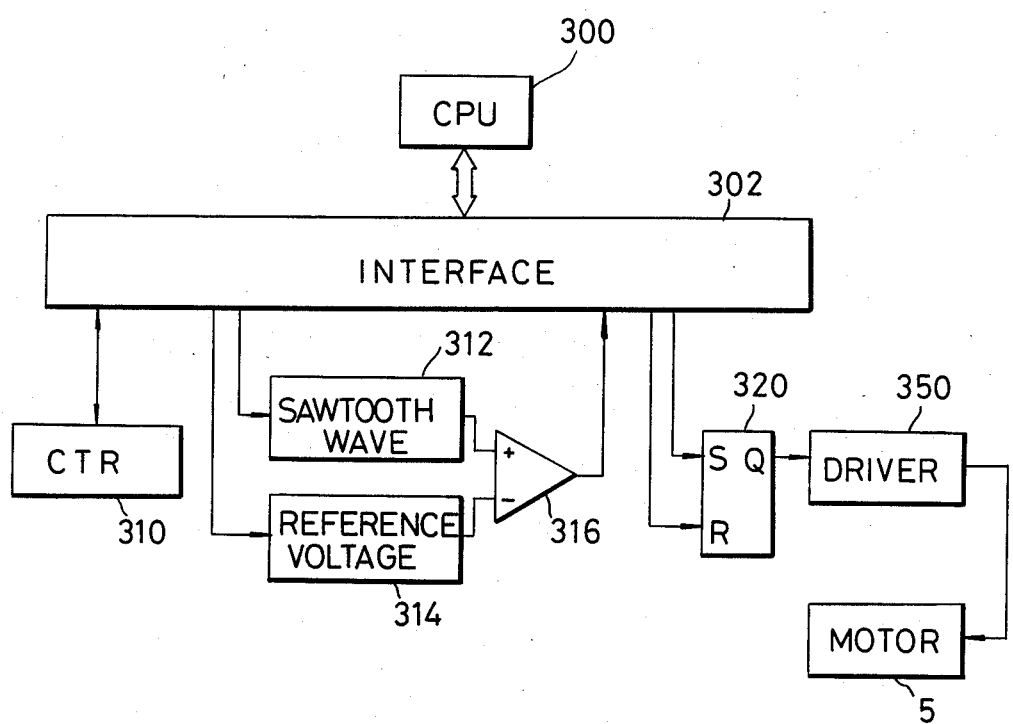
FIG. 12 is a circuit block diagram for a third embodiment of the invention.

FIG. 12 shows an embodiment of an apparatus for performing the method shown in FIG. 5. In this embodiment, a standard wafer alignment time $t_{2'}$ is preliminarily determined and in accordance with the ratio of the actual wafer alignment time $t_2$ to the standard time (i.e., the ratio obtained with respect to the preceding wafer in time sequency), the ratio between the times $t_7$ and $t_8$ during the following wafer changing is varied.

By so doing, it is possible to maintain the projection lens in the saturation state even if the wafer alignment time is varied.

In FIG. 12, a counter 310 counts the interval of time between the start and end of the wafer aligning operation. A sawtooth wave generator 312 applies a sawtooth wave to one terminal of an analog comparator 316. A reference voltage generator 314 applies a predetermined reference voltage to the other terminal of the comparator 316. The comparator 316 generates at its output terminal a pulse output of a duty ratio corresponding to the level of the reference voltage.

Figure 13:
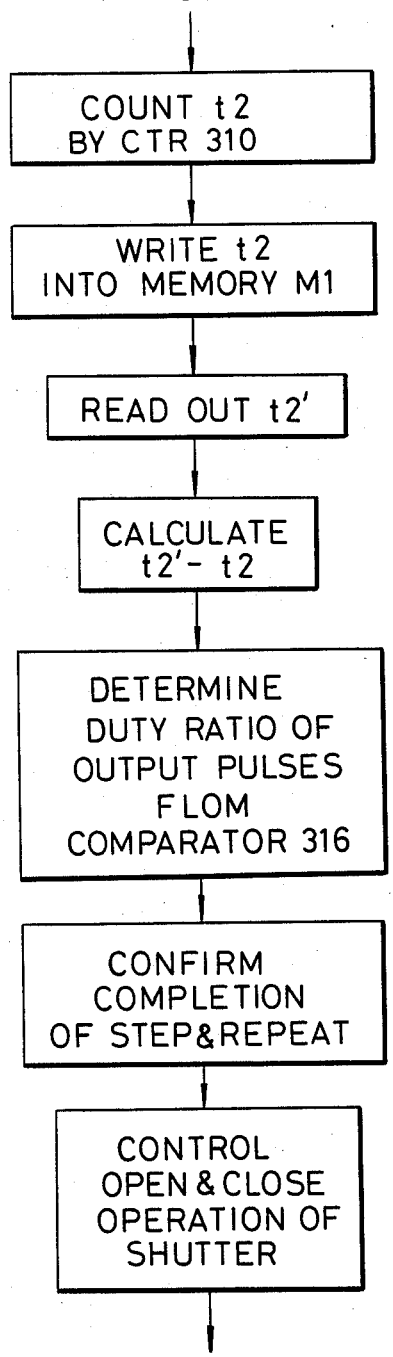
FIG. 13 is a flow chart showing the operation of the third embodiment.

Next, only the principal operations will be described with reference to the flow chart of FIG. 13. When the wafer alignment is started in a certain unit time, the counter starts counting and measures the time up to the end of the wafer alignment. Then, the wafer alignment time $t_2$ is stored at an address $M_1$ of the memory in a CPU 300. Then, the standard time $t_{2'}$ stored in the ROM of the CPU 300 is read out and the difference between the times $t_{2'}$ and $t_2$ is calculated. Then, in accordance with the result of the calculation the reference voltage level is varied and the duty ratio of the output pulses from the comparator 316 is determined. Then, when the completion of the step and repeat operation is confirmed, the opening and closing of the shutter during the wafer changing are controlled in accordance with the duty ratio of the output pulses from the comparator 316. By so doing, it is possible to maintain the projection lens in the saturation state. Note that the opening and closing of the shutter during the step and repeat operation are effected through the operation of the light quantity integrating circuit, the register 132 and the comparator 134 shown in FIG. 8. It is to be noted that the duty ratio may be controlled in accordance with the ratio between the opening and closing duration times of the shutter within the unit time.

Figure 14:
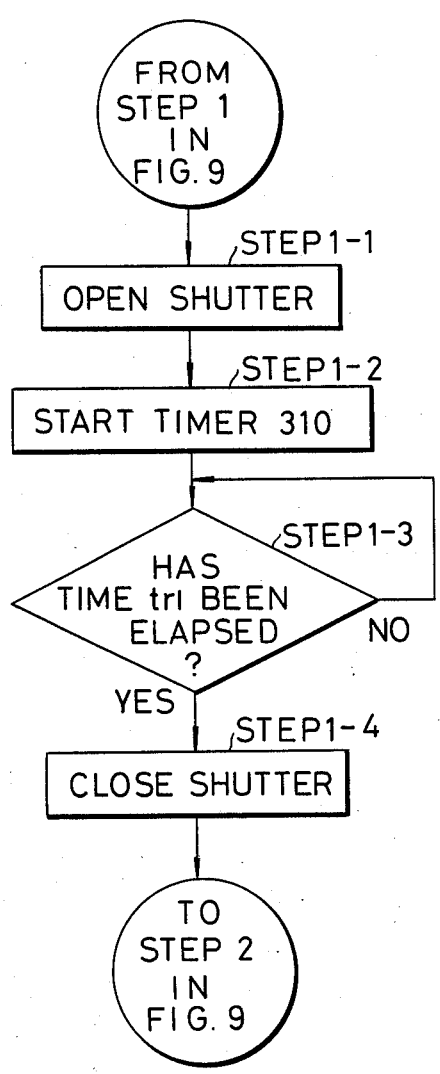
FIG. 14 is a flow chart showing the operation of a fourth embodiment of the invention.

The method shown in FIG. 7 can be performed by adding a timer circuit 401 to the construction of FIG. 8. In other words, when an operation start command for the exposure apparatus is received, the shutter is opened first and simultaneously the timer circuit 401 starts to count the time $t_{r1}$. When the time $t_{r1}$ expires, a transfer is made to the wafer changing step of FIG. 9. FIG. 14 shows the flow chart for this operation. Steps 1-1 to 1-4 for opening the shutter during the time $t_{r1}$ are added between the steps 1 and 2 of FIG. 9.

It is to be noted that if any other time than the wafer alignment time, such as the wafer changing time, is varied, the projection lens can be maintained in the saturation state by similar processing.

Next, a description will be given of the construction and operation of a reduction projection exposure apparatus which is applied to the above-mentioned embodiments.

FIG. 15 is a schematic diagram showing the mechanical construction of the reduction projection exposure apparatus. A wafer holder 21 for mounting a wafer 11 thereon is disposed on a stage 20 which is movable in the directions of X and Y axes which are perpendicular to each other. The wafer holder 21 is capable of making a small rotational movement relative to the stage 20. The coordinate positions of the stage 20 in the X and Y directions are measured by laser interferometer units 22 and 24, respectively. The stage 20 is moved to a predetermined wafer transfer position for transferring the wafer 11. A belt conveyer unit 26 operates in such a manner that an unexposed wafer is conveyed into the exposure apparatus or the exposed wafer is removed to the outside of the exposure apparatus. A wafer transfer arm 27 is rotatable about a shaft 28 and its forward end 27a forms a vacuum chuck for wafer chucking purposes. The transfer arm 27 is rotatable between the wafer holder 21 on the stage 20 at the wafer transfer position and the conveyer unit 26 to effect the transfer of wafers between the two.

The pattern image on a reticle 9 is focussed on the wafer by a projection lens 10. The optical axis of the projection lens 10 passes through the point of intersection of laser beams $L_1$ and $L_2$. The optical axis of a photoelectric microscope 30 for detecting the X-direction alignment of the wafer is perpendicular to the optical axis of the laser beam $L_1$. The optical axis of a photoelectric microscope 32 for detecting the Y direction alignment of the wafer is perpendicular to the optical axis of the laser beam $L_2$. A photoelectric microscope 34 is provided to detect the alignment of the wafer in the rotational direction ($\theta$ Direction) of the wafer.

The principle of the wafer alignment performed by this apparatus is described in detail in U.S Pat. No. 4,385,838 and therefore the alignment operation will be described only briefly. FIG. 16 shows the relative positions of the projection lens 10, the stage 20 and the photoelectric microscopes 30, 32 and 34. FIG. 17 shows the arrangement of the chip patterns and alignment marks on the wafer 11. As shown in FIG. 17 by way of example, rectangular chip pattern (typically two patterns are shown) and wafer alignment patterns are formed on the wafer 11 by the first exposure. Note that the rectangular coordinate system $\xi$-$\eta$ shows chip pattern alignment coordinates. Then, the center P of the $\xi$-$\eta$ coordinates represents the center point of the whole chip pattern area. Also, the segment connecting a Y-mark 33 and a $\theta$-mark 35 detected by the photoelectric microscopes 30 and 32 shown in FIG. 15 is parallel to the $\xi$ axis and the extension line of an X-mark 31 is parallel to the $\eta$ axis. Also, it is assumed that in the chip pattern located near the center of the wafer, the segment connecting the Y-mark 33 and the $\theta$-mark 35 and the extension line of the X-mark 31 intersect each other at the center P.

Then, after the wafer 11 has been mounted on the wafer holder 21, the wafer 11 is coarsely registered with respect to the stage 20 and then the wafer 11 is vacuum chucked. Then, the stage 20 is moved and thus the wafer 11 is moved to a position where the Y-mark 33 and the $\theta$-mark 35 can be respectively detected by the photoelectric microscopes 32 and 34. Since the X-direction distance between the photoelectric microscopes 32 and 34 is mechanically preset to a predetermined fixed value, it is assumed that the photoelectric microscope 32 detects a Y-mark 33' of a chip pattern located at the leftmost position on the $\xi$ axis and the photoelectric microscope 34 detects a $\theta$-mark 35 of a chip pattern located at the rightmost position on the $\xi$ axis.

To make the second and the following exposures of the wafer 11, a rotation correction is provided so as to prevent any rotational deviation between the X-Y coordinates of the stage 20 and the $\xi$-$\eta$ coordinates of the wafer 11. This rotation correction is made by the photoelectric microscopes 32 and 34. In other words, while detecting the Y-mark 33' by the photoelectric microscope 32, the wafer 11 is rotated so that the $\theta$-mark 35 is detected by the photoelectric microscope 32 and the X axis of the stage 20 is made parallel to the ξ axis of the wafer 11. At this time, the distance from the intersection of the X and Y axes to the optical axis of the photoelectric microscope 32 (i.e., the value inherent to the exposure apparatus) is preset into a Y-coordinate measuring register (not shown) and the wafer holder 21 is held at this rotational position. This operation will hereinafter be referred to as a Y-alignment. Then, the stage 20 is moved so that the photo-electric microscope 30 detects the Y-mark within the chip pattern near the center of the wafer 11. When this occurs, the Y axis of the stage 20 is made parallel to the η axis of the wafer 11 and the distance from the intersection of the X and Y axes to the optical axis of the photoelectric microscope 30 (i.e., the value inherent to the exposure apparatus) is preset into an X-coordinate measuring register (not shown). This operation will hereinafter be referred to as an X alignment. By virtue of the Y-θ alignment and the X alignment described so far, the X-Y axes of the stage 20 correspond to the ξ-η axes of the wafer 11. Thereafter, by measuring the X-Y coordinate values of the stage 20 by the laser interferometers, it is possible to detect the position of the wafer 11 and perform the step and repeat operation easily.

Figure 18:
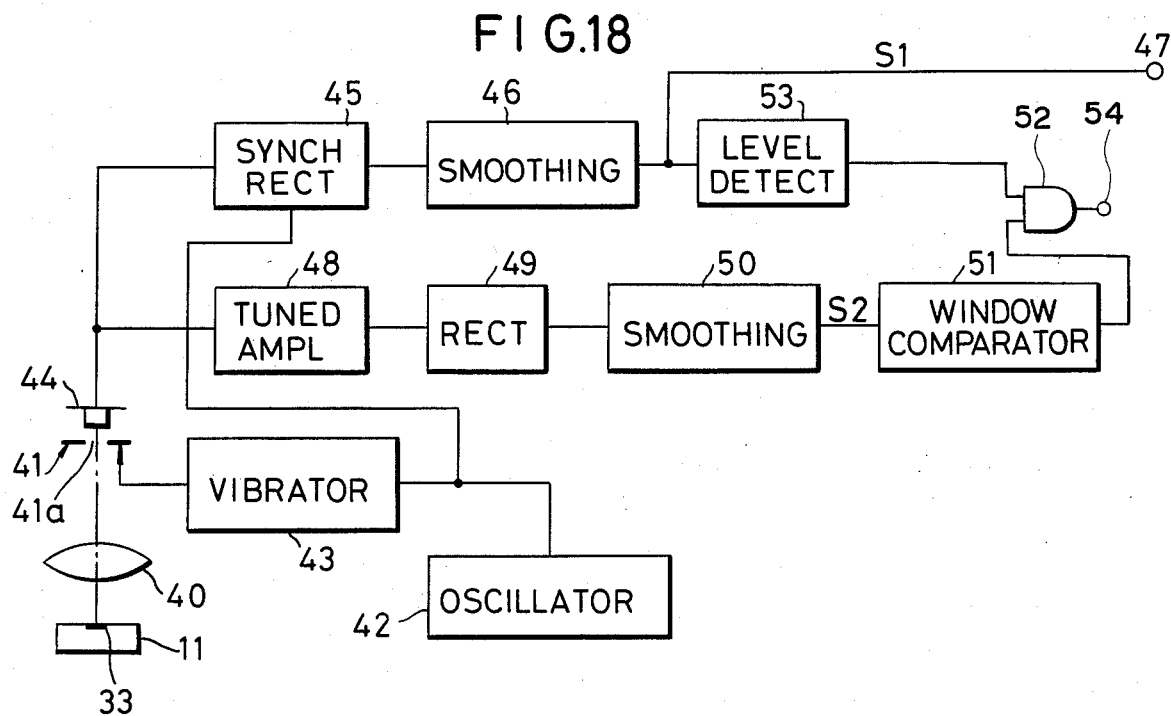
FIG. 18 is a block diagram showing the electric system of the photoelectric microscope.
Figure 19A:
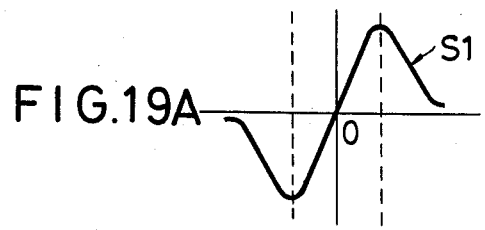
FIGS. 19A and 19B are output signal waveform diagrams for the microscope of FIG. 18.

FIG. 18 is a specific example of the photoelectric microscopes used for wafer aligning purposes. The alignment mark (e.g., the Y-mark 33) of the wafer 11 is illuminated by a light beam of a wavelength to which the photoresist is not sensitive and its optical image is focussed by an objective lens 40 on a slit plate 41 having a slit 41a. An oscillator 42 generates a sine wave signal cf a fixed frequency to operate vibrating means 43. The vibrating means 43 is coupled to the slit plate 41 so that the slit 41a is sinusoidally vibrated to scan the alignment mark. The direction of the vibration is perpendicular to the lengthwise direction of the alignment mark. A photoelectric conversion element 44 receives the light passed through the slit 41a and converts it to an electric signal. A synchronous rectifier circuit 45 synchronously rectifies the electric signal from the photoelectric conversion element 44 by using the sine wave signal as a reference signal and a smoothing circuit 46 smooths the synchronous rectified signal to a dc signal, which in turn is delivered to a terminal 47. This dc signal S1 varies as shown in FIG. 19A in accordance with the positional relation of the vibration center (O) of the slit 41a and the alignment mark. The stage 20 or the wafer holder 21 is subjected to a servo control so that the dc signal S1 is reduced to a zero level during the alignment operation.

Figure 19B:
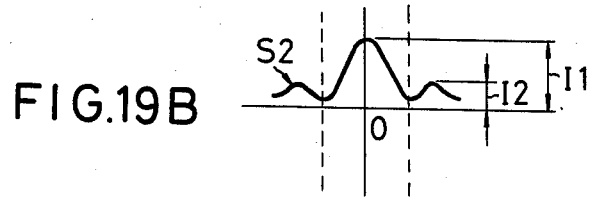

On the other hand, the electric signal from the photoelectric conversion element 44 is applied to a tuned amplifier 48 having a tuned frequency which is two times the frequency of the output signal from the oscillator 42. The output of the tuned amplifier 48 is rectified by a rectifier circuit 49 and then smoothed by a smoothing circuit 50 to generate a dc signal S2. The dc signal S2 from the smoothing circuit 50 varies as shown in FIG. 19B in accordance with the positional relation of the vibration center (O) of the slit 41a and the center of the alignment mark. A window comparator 51 applies a signal to one input terminal of an AND gate 52 only when the dc signal S2 from the smoothing circuit 50 has a level between dc levels I1 and I2 of FIG. 19B. A level detecting circuit 53 applies a signal to the other input terminal of the AND gate 52 when the level of the dc signal from the smoothing circuit 46 is zero. Thus, the AND gate 52 generates an output at a terminal 54 when the vibration center of the slit 41a coincides with the center of the alignment mark.

In FIGS. 19A and 19B, the ordinate represents the dc signal level and the abscissa represents the amount of positional deviation of the alignment mark from the vibration center (O) of the slit 41a.

FIG. 20 is a block diagram showing a control system of the reduction projection exposure apparatus. This control system employs a microcomputer including memories, etc., for enabling a sequence control of the exposure apparatus and various computational operations in accordance with programs. A CPU 60 performs the reception of measured (detected) data from and the transmission of commands to the photoelectric microscopes, the drivers and the interferometers through an interface 61.

A belt conveyer control system 62 is responsive to a command from the CPU 60 to operate the belt conveyer unit 26 to move in an unexposed wafer or move out the exposed wafer from the exposure apparatus. The CPU 60 takes in through the interface 61 information as to whether the unexposed wafer has been conveyed to a position for transferring it to the transfer arm 27 and information as to whether the exposed wafer has been moved out of the exposure apparatus. A wafer transfer arm control system 63 is responsive to a command from the CPU 60 to control the rotation and vacuum chucking of the arm 27 for the transfer of a wafer between the wafer holder 21 and the belt conveyer unit 26. The information concerning the position of the arm 27 and the information concerning the chucking of the wafer are taken into the CPU 60 through the interface 61. The stage 20 is moved in the X direction by an X-driver 64 and in the Y direction by a Y-driver 65. The laser interferometers 22 and 24 respectively send the X-direction and Y-direction movement information of the stage 20 to the CPU 60 through the interface 61. The CPU 60 includes the X-coordinate measuring register and the Y-coordinate measuring register. The previously mentioned distance information of the intersection of the X and Y axes and the optical axes of the photoelectric microscopes 30 and 32 are stored in the ROM of the CPU 60. Then, the distance information in the ROM are preset in these registers by the wafer aligning operation utilizing the photoelectric microscopes 30, 32 and 34. Thereafter, the counts of the registers are varied in accordance with the amounts of X-direction and Y-direction movements and the directions of X-axis and Y-axis movements of the stage 20 and thus the coordinates of the stage 20 are always measured.

A θ-driver 66 is provided to rotate the wafer holder 21.

A shutter control system 67 is provided to open and close the rotary shutter 4 by means of the motor 5 of FIG. 1. In accordance with the sensitivity of the photoresist applied to the wafer 11, the CPU 60 calculates the proper exposure value for exposing the photoresist and sends it to the shutter control system 67. The sensitivity of the photoresist is sent to the CPU 60 from a keyboard 68 through the interface 61. Although it differs depending on which of the four methods shown in FIGS. 3 to 7 is used, the CPU 60 calculates the shutter open time ($t_4$; $t_5$, $t_6'$, $t_7$;$t_{r1}$) required for maintaining constant the amount of exposure wavelength energy incident to the projection lens and sends it to the shutter control system 67. A reticle alignment system 69 is provided to move a reticle 9 for alignment with a predetermined position with respect to the optical axis of the projection lens 10.

A timer circuit 70 starts its time measurement in response to the start of the wafer aligning operation and it generates a timer output at the expiration of a predetermined time $T_{max}$ (a time sufficient for determining the inability of wafer alignment).

Figure 21C:
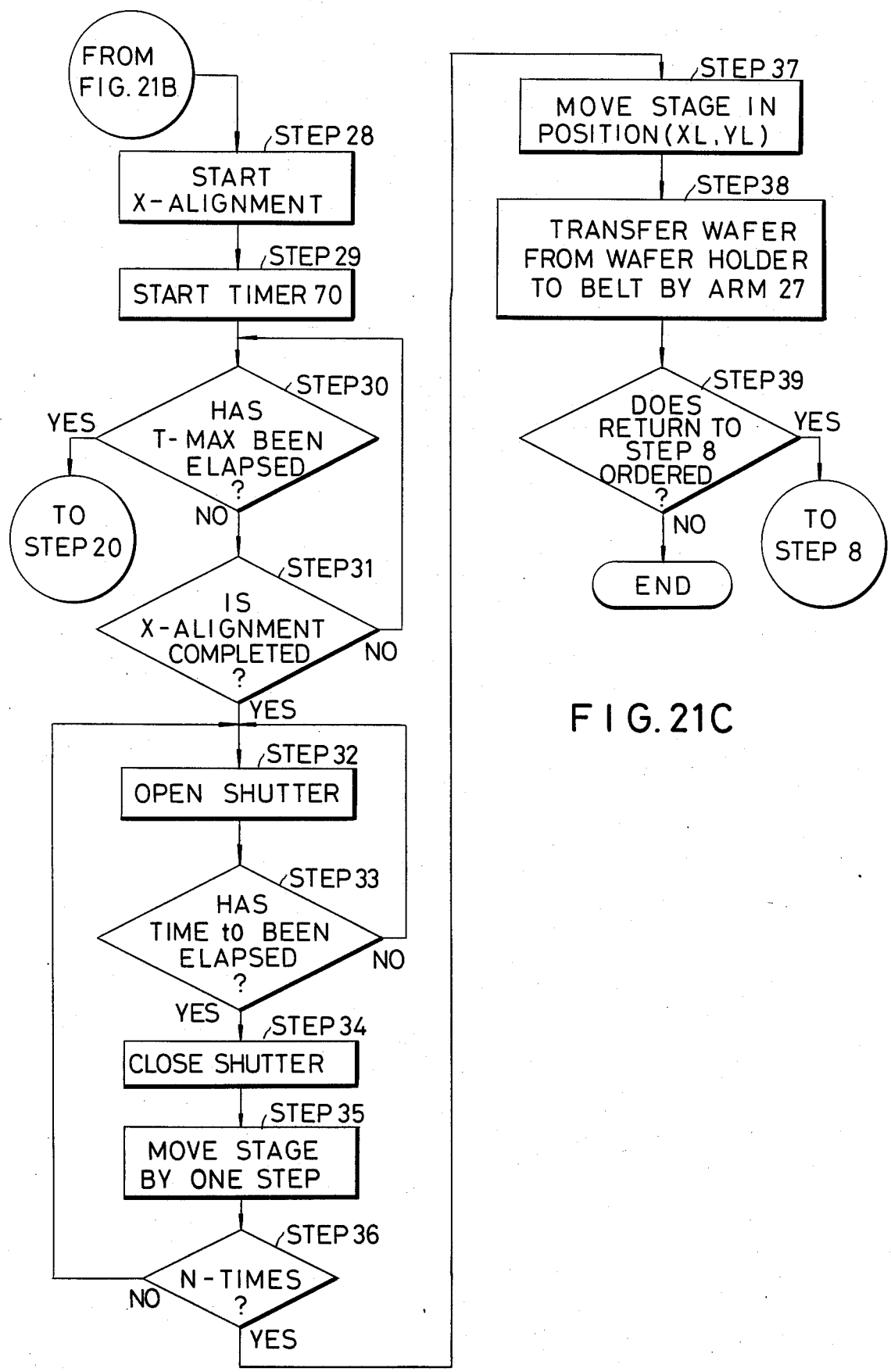

Next, the operation of the exposure apparatus shown in FIGS. 15 to 20 will be described. FIGS. 21A, 21B and 21C show flow charts of processing steps. Note that a description is made of a case where the wafer is formed with the alignment marks of FIG. 17 by the first exposure and development is subjected to the second exposure. When the operator enters an operation start command for the exposure apparatus from the keyboard 68 so that the operation of the apparatus is started, the reticle 9 is loaded into the exposure apparatus. When the reticle loading is completed, the CPU 60 causes the reticle alignment system 69 to start the alignment of the reticle 9. When the reticle alignment is completed, the reticle alignment system 69 sends an end of reticle alignment signal to the CPU 60 through the interface 61 so that the reticle 9 is held fixedly in the alignment completion position and the reticle alignment is ended. Then, at steps 3 and 4, the CPU 60 reads in the present position of the stage 20 (whose coordinates are XA and YA) from the outputs of the laser interferometers 22 and 24 and calculates its deviation from the wafer transfer position of the stage 20 (whose coordinates are XL and YL) which is stored in the ROM of the CPU 60. In accordance with the result of the deviation calculation, the CPU 60 sends X-direction and Y-direction drive information for bringing the stage 20 to the wafer transfer position to the X-driver 64 and the Y-driver 65, respectively. At steps 5 to 7, the X-driver 64 and the Y-driver 65 move and stop the stage 20 at the wafer transfer position in accordance with the drive information. At steps 8 to 10, if it is determined from the outputs of the laser interferometers 22 and 24 that the stage 20 has been moved to the wafer transfer position, it is confirmed whether the wafer on the belt conveyer unit 26 has been conveyed by the wafer transfer arm 27 to a position where it can be vacuum chucked. For this purpose, it is only necessary to supply to the CPU 60 through the interface 61 the output of a photo coupler or the like which is capable of photoelectrically detecting the wafer on the belt. When this confirmation is not made, the belt conveyer unit 26 is operated to move the wafer into the position and upon confirming it the conveying operation of the belt conveyer unit 26 is stopped. At the following steps 11 and 12, the wafer transfer arm 27 vacuum chucks the wafer on the belt, carries it above the wafer holder 21 and transfers it over the wafer holder 21. Then, the arm 27 is returned to a predetermined wait position. On the other hand, the wafer holder 21 makes a rough alignment of the wafer and the stage 20 by means of the orientation flat of the wafer. The purpose of this rough alignment is to preliminarily reduce the rotational deviation between the X-Y coordinate system of the stage 20 and the $\eta$ - $\xi$ coordinate system of the wafer. The time required for performing the steps 11 and 12 corresponds to the previously mentioned wafer changing time. Since the wafer is shifted to a position apart from below the projection lens 10 so far as the stage 20 is in the wafer transfer position, during the interval the shutter control system 67 operates the shutter in accordance with one of the four methods shown in FIGS. 3 to 7.

After the rough alignment of the wafer has been completed, the processing advances through steps 14 to 16 so that in accordance with the position information of the photoelectric microscopes 32 and 34 which are stored as the apparatus constants in the ROM, the CPU 60 moves the wafer through the stage 20 in such a manner that the alignment marks 33' and 35 shown in FIG. 17 are respectively positioned opposite to the photoelectric microscopes 32 and 34. The position of the wafer at this time is referred to as a Y-$\theta$ alignment position. When the CPU 60 confirms from the outputs of the laser interferometers 22 and 24 that the stage 20 has been moved into the Y-$\theta$ alignment position, it stops the stage 20 and starts a Y-$\theta$ alignment by the photoelectric microscopes 32 and 34. Simultaneously with the start of the Y-$\theta$ alignment, the timer circuit 70 starts its time measurement so that if the Y-$\theta$ alignment is not completed even after the expiration of the predetermined time $T_{max}$, the stage 20 is returned to the wafer transfer position at a step 20. When this occurs, the shutter control system 67 opens and closes the shutter so as to project the exposure wavelength energy and attain a saturation state of the projection lens. In this case, if the operator enters a return command to the step 14 by the keyboard 68 at a step 22, the Y-$\theta$ alignment is started again. If an end command is keyboarded, the exposure operation is ended.

On the other hand, the completion of the Y-$\theta$ alignment within the predetermined time $T_{max}$ is monitored at a step 23 so that the timer circuit 70 is reset when Y-$\theta$ alignment is completed. Then, at the following steps 25 to 27, the stage 20 is moved to a position where the alignment mark 31 of FIG. 17 is opposite to the photoelectric microscope 30 or an X-alignment position.

Then, the x-alignment is started and simultaneously the timer circuit 70 starts its time measurement. Thereafter, the processing advances through the steps 20 to 22 when the completion of the X-alignment is not confirmed during the interval between the start of the X-alignment and the lapse of the predetermined time $T_{max}$ and the processing advances through the following steps 32 to 36 when the completion of the X-alignment is confirmed within the time $T_{max}$.

The steps 32 to 36 form a so-called step and repeat process of repeating the operation whereby when a reticle pattern is printed in one selected area of the wafer, the stage is moved and the reticle pattern is again printed in the next selected area of the wafer. When the exposure is made N times for the same wafer, a transfer is made to a step 37 where the stage 20 is moved to the wafer transfer position. Then, the arm 27 is rotated from the waiting position to a position above the wafer holder 21 so as to receive and transfer the wafer onto the belt. Then, the exposed wafer is removed to the outside of the exposure apparatus by the belt conveyer unit 26. Then, when a new wafer is supplied onto the belt, a return is made to the step 8 and the similar operations are repeated the same number of times as the desired number of lots.

In the above-described embodiment, when the light energy passed through the projection lens reaches the stage 20 during the time $t_4$, $t_5$, $t_6$, $t_7$ or $t_{r1}$ in which the shutter is opened for purposes other than the exposure, there is the danger of the alignment accuracy being affected detrimentally due to a thermal deformation of the stage 20.

Figure 22:
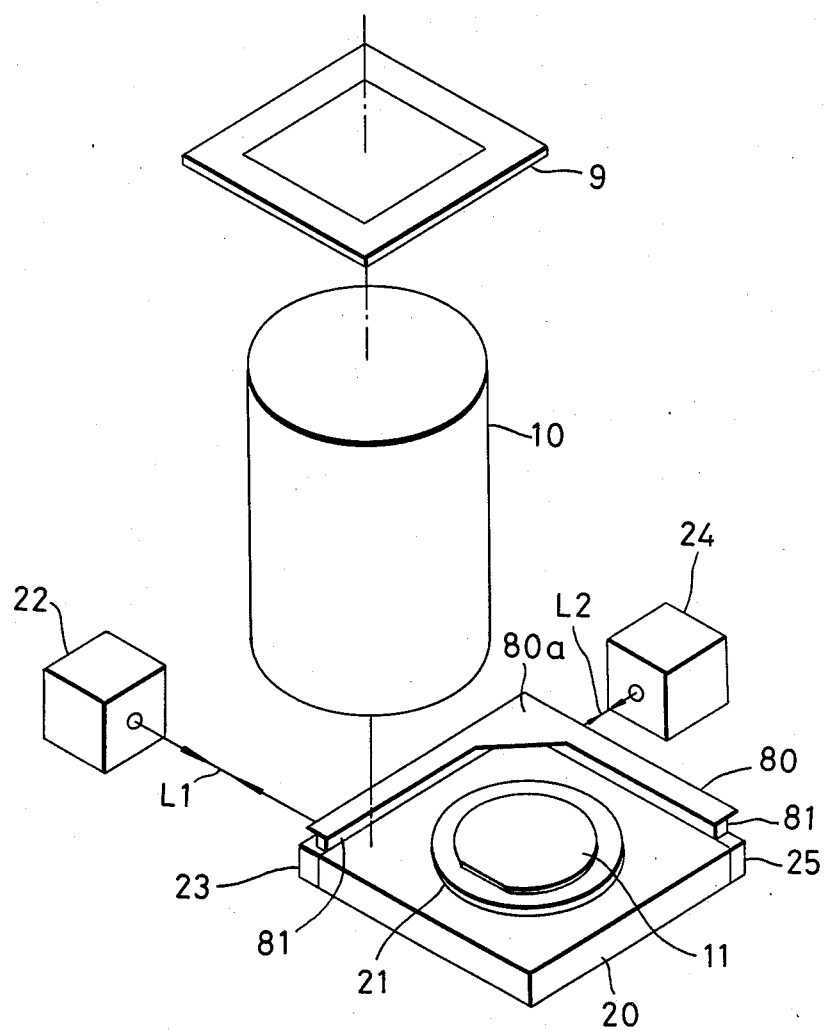
FIG. 22 is a schematic diagram showing the mechanical construction of another projection exposure apparatus to which the invention is applied.

FIG. 22 shows another embodiment of the invention in which, with a view to particularly preventing effectively any thermal expansion of first and second mirrors 23 and 25 arranged on the sides of the stage 20 which are illuminated by the laser beams 22 and 24, respectively, an L-shaped shielding plate 80 is fixedly mounted on the stage 20 to cover the first and second mirrors 23 and 25 from above. Heat insulators 81 are interposed between the shielding plate 80 and the stage 20, thus preventing the heat of the shielding plate 80 from being transmitted to the stage 20 and the mirrors 23 and 25. An overhang portion 80a of the shielding plate 80 is arranged in a position where the transmitted light from the projection lens falls when the stage 20 is moved into the wafer transfer position.

The size of the overhang portion 80a is sufficient if it can prevent the transmitted light from the projection lens from reaching the stage 20. By so arranging, it is possible to ensure that the transmitted light from the projection lens is blocked by the shielding plate 80 and the stage 20 and the first and second mirrors 23 and 25 are not subjected to any thermal effect.

It is to be noted that while the shielding plate 80 may be made of a light absorbing material, the following effects will be produced if the shielding plate 80 has the same reflectance as the wafer or the photoresist applied to the wafer. In other words, during the step and repeat operation the exposure light reflected by the wafer or the photoresist is projected to the projection lens and thus the projection lens is subjected to a thermal factor from the wafer side. Therefore, if the reflectance of the shielding plate 80 is selected as mentioned above, the shielding plate 80 is subjected to substantially the same thermal factor during both the step and repeat operation and other times when the shutter is open and this has the effect of making it easy to maintain the ratio $\tau$ constant.

Also, a shutter may be arranged between the projection lens 10 and the stage 20 so as to shield the two from each other in circumstances other than the step and repeat operation and the wafer alignment operations.

Generally, the photoresist applied to the wafer has such characteristics that it is sensitized by a light beam of a particular wavelength. Thus, by arranging so that besides the particular light beam used during the exposure of the wafer, a light beam of a wavelength ineffective on the photoresist is projected to the projection lens so as to thermally stabilize it during the unexposure periods, it is possible to position the wafer in the projected light beam even during the periods of wafer alignment and wafer transfer.

Figure 23:
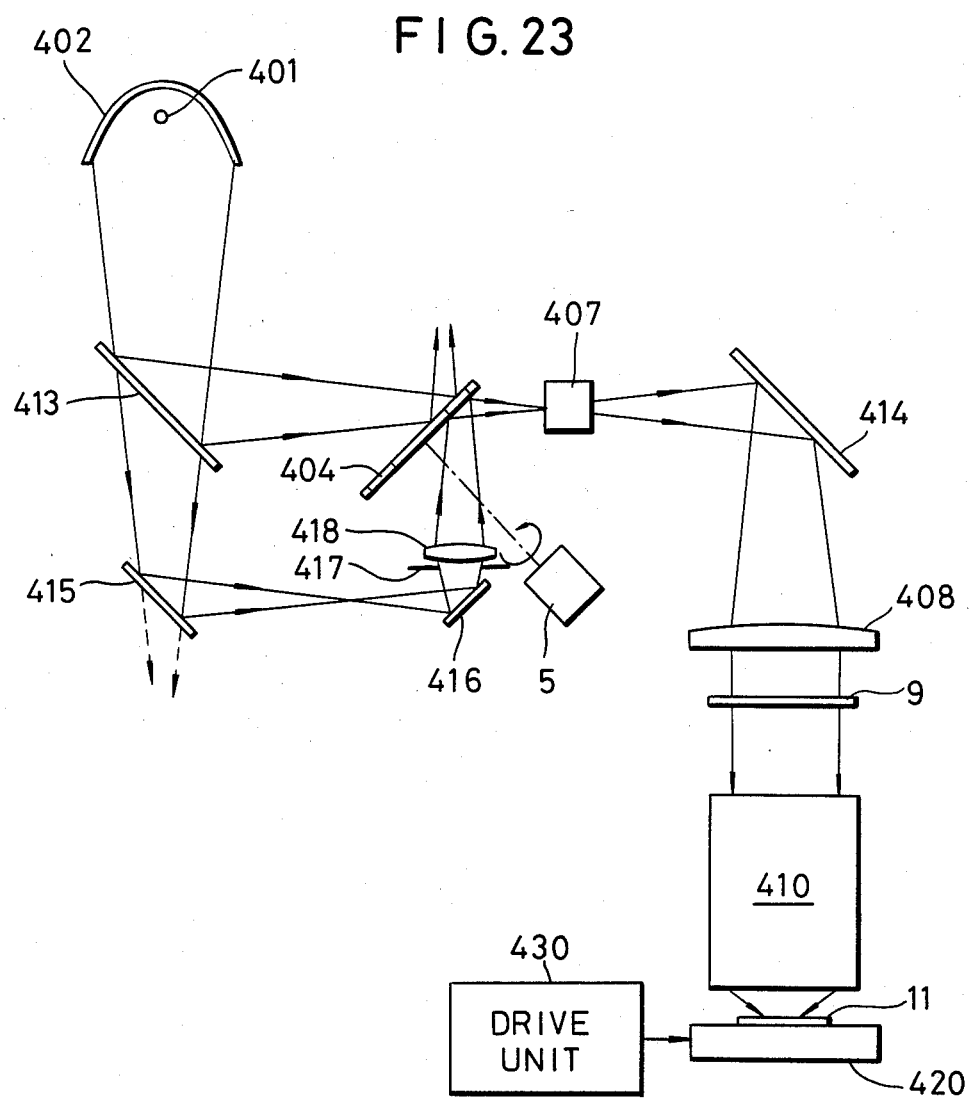
FIG. 23 is a schematic diagram of a projection exposure apparatus incorporating a fifth embodiment of the invention.

FIG. 23 shows another embodiment which conforms with the above-mentioned arrangement and a light source 401 arranged at a first focal point of an ellipsoid mirror 402 emits a light beam including a wavelength component to which the photoresist is sensitive and a wavelength component to which the photoresist is insensitive. If the light source 401 comprises a mercury-vapor lamp, the sensitive wavelength component may, for example, be a g-line light (wavelength is 436 nm) and the insensitive wavelength component may, for example, be an e-line light (wavelength is 546 nm). A cold mirror 413 is a dichroic mirror which selectively reflects the g-line light and transmits the other light.

The light beam from the light source 401 is condensed by the ellipsoid reflecting mirror 402 and then the g-line light is reflected and directed to a shutter 404 by the cold mirror 413.

The shutter 404 is a rotary shutter having a reflector on each side and it has substantially the same shape as the shutter 4 shown in FIG. 2. A projection optical system includes an optical integrator 407, a mirror 414, a condenser 408 and a projection lens system 410 and it projects a pattern image of a reticle 9 on a wafer 11. A dichroic mirror 415 selectively reflects and directs the e-line light to the back reflecting surface of the shutter 404 through a stop 417 and a lens 418.

During the unexposure period in which the shutter 404 blocks the optical path between the cold mirror 413 and the integrator 407, the g-line light reflected by the cold mirror 413 is reflected by the front reflecting surface of the shutter 404. This reflected light is used as an illuminating light source for the alignment microscopes. On the other hand, the e-line light reflected by the dichroic mirror 415 is passed through the mirror 416 and the lens 418, reflected by the back reflecting surface of the shutter 404, projected to the integrator 407 and then directed to the projection lens system 410. During the exposure period in which the shutter 404 is rotated and moved away from the optical path between the cold mirror 413 and the integrator 407 by the motor 5, the g-line light reflected by the cold mirror 413 is directed to the projection lens system 410 through the integrator 407 and the pattern of the reticle 9 is projected on the wafer 11 by the g-line light. In this case, the e-line light from the lens 418 is passed through the shutter 404 and therefore it is not projected to the integrator 407 and the projection lens system 410.

Figure 24:
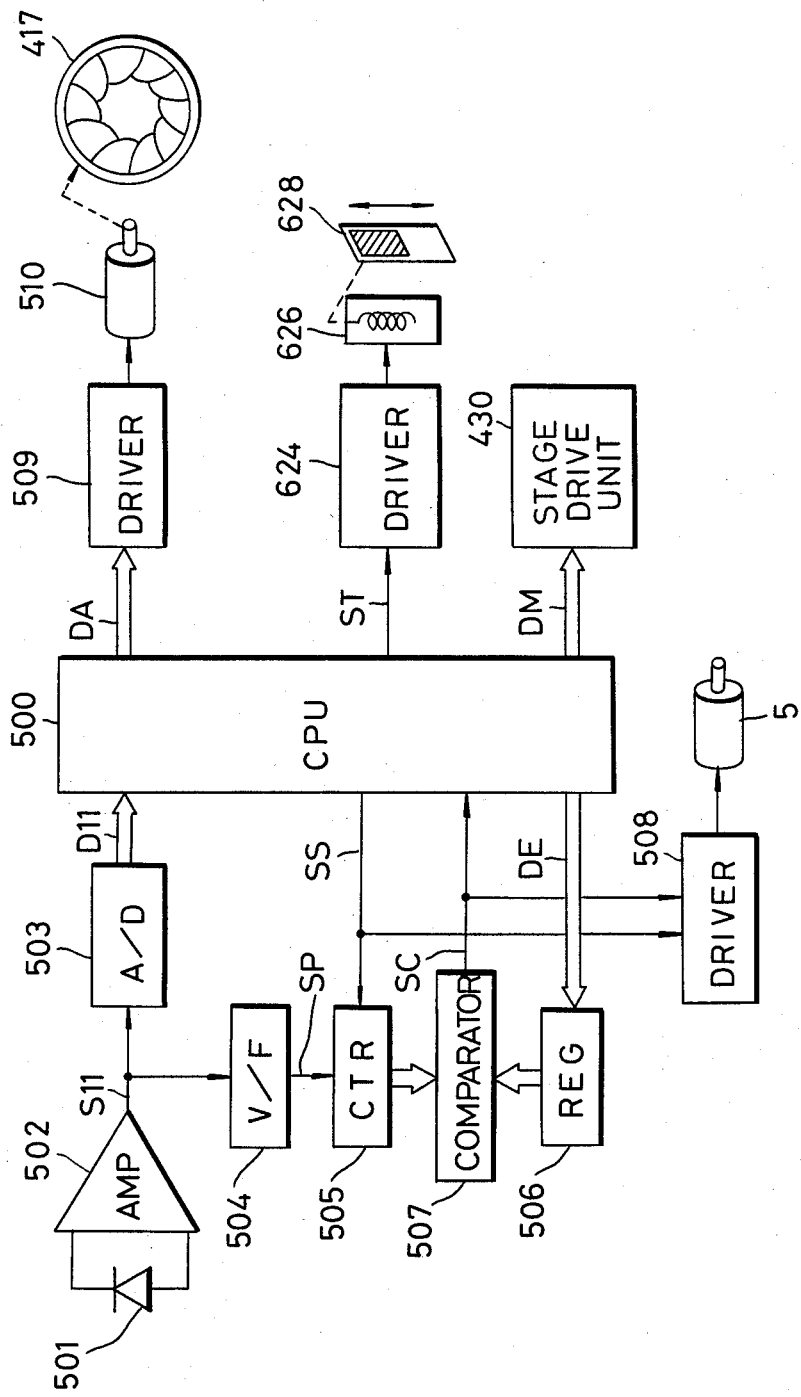
FIG. 24 is a control block diagram of the embodiment shown in FIG. 23.

FIG. 24 shows a control system for controlling the shutter 404 and the aperture number of the stop 417.

The overall sequence of operations is controlled collectively by a CPU 500. The CPU 500 includes a microprocesser (MPU), memories such as RAM and ROM, input/output ports (I/O ports) for interfacing with external units, etc.

A photosensitive element 501 is arranged in the optical path between the condenser 408 and the reticle 9 at a peripheral position where it does not block the direct illuminating light beam to the reticle 9 so as to detect the intensity of the illuminating light in the vicinity of the reticle 9.

An amplifier 502 amplifies the photoelectric output of the photosensitive element 501 to generate a signal S11. An A/D converter 503 converts the signal S11 to a digital form and supplies the resulting digital value D11 to the CPU 500. The signal S11 is also converted to a digital form by a voltage-frequency converter 504 to generate pulse signals SP of a frequency corresponding to the voltage of the signal S11. A counter 505 counts up the pulse signals SP. The counter 505 is responsive to a pulse-type start signal SS from the CPU 500 to clear its count content to zero.

On the other hand, the CPU 500 supplies a data DE corresponding to the desired exposure value to a register 506. A comparator 507 compares the count data from the counter 505 and the data DE set in the register 506 and generates a coincidence signal SC when the two are equal. The start signal SS and the coincidence signal SC are applied to a driver circuit 508 for the shutter 404. The driver circuit 508 is responsive to the start signal SS to apply to the pulse motor 5 the required drive pulse for rotating the shutter 404 by $\frac{1}{8}$ of a revolution (45 degrees). As a result, the shutter 404 is opened and the reticle 9 is illuminated by the g-line light. Also, the driver circuit 508 is responsive to the coincidence signal SC to generate the required drive pulse for rotating the shutter 404 by another 45 degrees and thereby close the shutter 404. The CPU 500 supplies to a driver circuit 509 a data DA for determining the aperture value of the stop 417. The driver circuit 509 supplies a drive signal corresponding to the aperture value to a motor 510 for driving the stop 417 and the aperture value of the stop 417 is set to the desired value. Also, the CPU 500 supplies to a stage drive unit 430 a data DM for moving a stage 420, thereby controlling the stepping (step movements) of the stage 420.

At the beginning of the operation of this embodiment, the operation of calibrating the magnification variations of the projection lens system 410 against the intensities of the two light beams is performed. This calibration is made only during the manufacture of the apparatus and the results are stored as apparatus constants in the ROM or the like of the CPU 500, thereby eliminating the need for any calibration during the exposure of a wafer. However, considering the variation with time of the light intensity of the light source 401 and the change of the light sources, it is desirable to perform the calibration upon the connection of the apparatus to the power source.

Then, before making the calibration, the amount of magnification variation $\Delta M_g$ due to the g-line light and the light intensity $B_g$ of the g-line light are stored in the CPU 500. The intensity $B_g$ can be easily measured by reading the output D11 of the converter 503 at intervals of a given time and averaging the read values.

After the apparatus has been connected to the power source, the CPU 500 generates a data DA for maximizing the aperture value of the stop 417 and thus the e-line light is projected at the maximum intensity to the projection lens system 410 without passing through the reticle 9. It is to be noted that in this embodiment the stop 417 is constructed so that instead of varying the area of the reticle illuminated by the e-line light, only the intensity of the e-line light is varied while illuminating the whole surface of the reticle at all times. Then, with the aperture of the stop 417 increased to the maximum, the amount of magnification variation $\Delta M_e$ and the then current average intensity $B_e$ of the e-line light are measured. Also, in this case, the output D11 of the converter 503 is used. For the measurement of the magnification variation amount $\Delta M_e$, a test reticle is used which includes a reference mark arranged at a position crossing the optical axis of the projection lens system 410 and a plurality of verniers arranged to surround the reference mark. During this measurement, the shutter is closed and the e-line light is continuously projected to the projection lens system 410. Then, after the expiration of a predetermined time, the CPU 500 applies a test reticle feed request signal to a display unit which is not shown. Then, after the test reticle has been fed into the apparatus manually or automatically, the test reticle is aligned and the exposure is started. At this time, the CPU 500 sets a data DE in the register 506 and generates a start signal SS. As a result, the counter 505 is cleared and the shutter is opened, thereby generating pulse signals SP from the converter 504. Thus, the count of the counter 505 corresponds to the integrated light quantity value of the g-line light since the start of opening of the shutter. Thus, when the count coincides with the data DE so that the comparator 507 generates a coincidence signal SC, the shutter is rotated by 45 degrees and closed. When the shutter is open, the pattern of the test reticle is printed on the pattern of the wafer. In this way, the CPU 500 repeats the operation of projecting the pattern of the test reticle onto the wafer and projecting the e-line light to the wafer for a predetermined time and the data D11 from the converter 503 is read in at intervals of a suitable time during the projection of the e-line light.

After the thus exposed wafer has been developed, the photoresist images of the verniers are read by a microscope or the like and the magnification variation value $\Delta M_e$ is determined. The value $\Delta M_e$ is inputted from a terminal equipment which is not shown so as to be stored in the memory of the CPU 500. Of course, the CPU 500 determines the intensity $B_e$ by calculation and stores it in the memory. Then, the CPU 500 calibrates the intensity of the e-line light against the intensity of the g-line light. More specifically, the ratio of the intensity of the e-line light to the intensity of the g-line light for obtaining the same amount of magnification variation is calculated from the following equation $$K = \frac{\Delta M_g}{\Delta M_e} \cdot \frac{B_e}{B_g}$$

For this purpose, it is only necessary that during the actual exposure of a wafer by the step and repeat method the intensity $B_g$ of the g-line light is measured from time to time by the converter 503 and the aperture value of the stop 417 is controlled to attain $KB_g$. Thus, since the projection lens system receives the g-line light during the exposure periods and the e-line light during the unexposure periods, the projection lens system always receives the light energy so that the temperature of the projection lens system is maintained constant and its optical characteristic, e.g., magnification, is maintained at a constant value.

Figure 25:
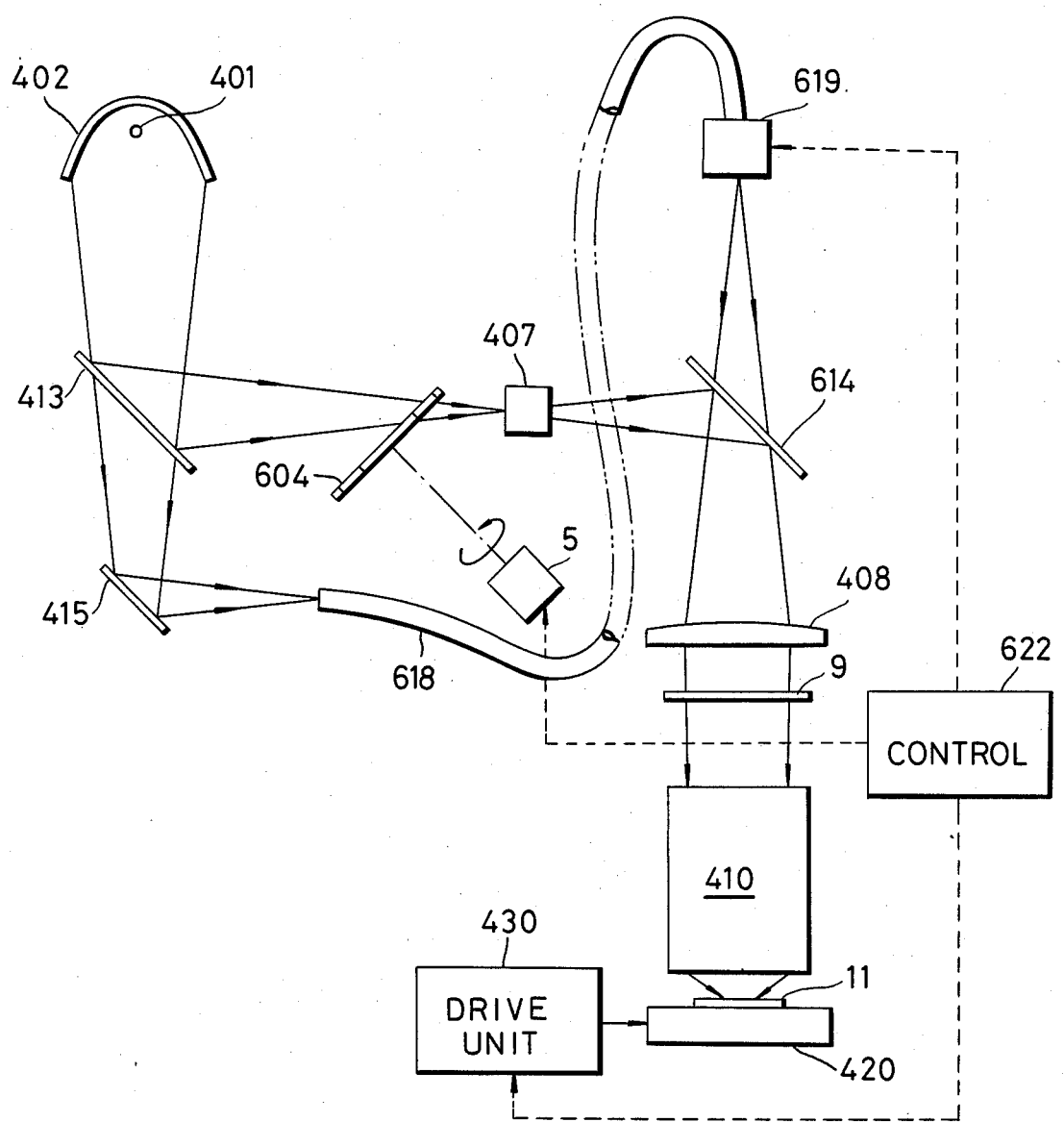
FIG. 25 is a schematic diagram of a projection exposure apparatus incorporating a sixth embodiment of the invention.

The apparatus of FIG. 23 may be modified as shown by the embodiment of FIG. 25. In FIG. 25, the e-line light reflected by the dichroic mirror 415 is condensed at one end of an optical fiber 618. The other end of the optical fiber 618 is connected to an optical unit 619 including a stop of the same type as the stop 417, a sub-shutter, an optical lens, etc. The e-line light emitted from the optical unit 619 is transmitted through a cold mirror 614 and projected to the projection lens system 410. The cold mirror 614 has such spectral characteristics that it reflects the g-line light from the integrator 407. A control unit 622 is all the same with the circuitry shown in FIG. 24 except that there is additionally provided a control circuit for the sub-shutter within the optical unit 619. As shown in FIG. 24, the sub-shutter control circuit comprises a driver circuit 624 responsive to the on/off signal ST from the CPU 500 to apply a drive signal to a solenoid 626 for reciprocating the sub-shutter 628. Note that in FIG. 25, a shutter 604 is of the same type as the shutter 4 shown in FIG. 2. While the opening and closing of the sub-shutter 628 are basically effected in association with the opening and closing of the shutter 604 under the control of the CPU 500, the present embodiment is not necessarily limited thereto. Thus, the operation of the embodiment is such that basically the e-line light is projected to the projection lens system 410 through the optical fiber 618, the optical unit 619 and the cold mirror 614 during the unexposure periods and the g-line light reflected from the cold mirror 413 is projected to the projection lens system 410 through the shutter 604, the integrator 407, the cold mirror 614 and the condenser 408 during the exposure periods.

Figure 26:
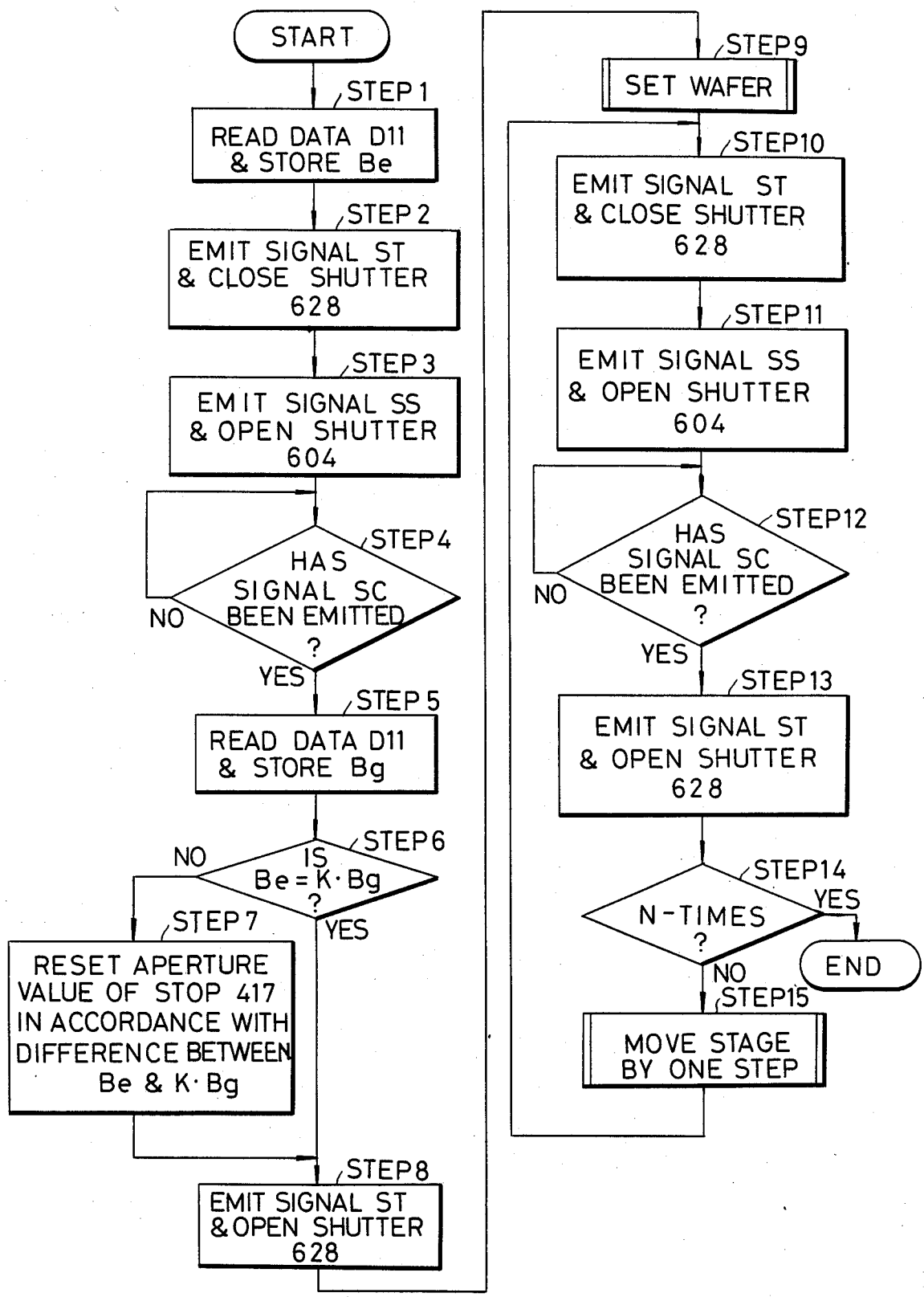
FIG. 26 is a flow chart showing the operation of the embodiment shown in FIG. 25.

Next, the operation of the embodiment shown in FIG. 25 will be described in detail with reference to the flow chart shown in FIG. 26. Initially, it is assumed that the subshutter 628 is open and that no wafer is mounted within the exposure apparatus as yet. When the exposure operation is started, the CPU 500 reads the data D11 from the converter 503 and stores the intensity $B_e$ of the e-line light at a step 1. Then, at a step 2, the CPU 500 generates an on/off signal ST and closes the sub-shutter 628. Then, at a step 3, the CPU 500 generates a start signal SS and opens the shutter 604. In this case, while the shutter 604 is controlled by the operations of the counter 505, the register 506 and the comparator 507 so that it is opened to attain the desired exposure value, here the shutter 604 is opened for the purpose of projecting the g-line light to the photosensitive element 601 and therefore the duration of opening of the shutter 604 may be suitably selected. Then, at a step 4, a decision is made as to the generation of a coincidence signal SC so that if there is the coincidence signal SC, a transfer is made to the next step 5 where the CPU 500 reads in and stores the data D11 from the converter 503. At this time, while the opening of the shutter 604 is started in response to the coincidence signal SC, there is some time lag and therefore the converter 503 digitizes the intensity of the g-line light received by the photosensitive element 501 just prior to the start of the opening of the shutter 604. As a result, the data D11 read at the step 5 corresponds to the intensity $B_g$ of the g-line light. Then, at a step 6, in accordance with the intensities $B_e$ and $B_g$ stored at the step 1, the CPU 500 determines whether the intensity $B_e$ is equal to the value of $KB_g$ by using the previously mentioned constant K. If it is not, a transfer is made to a step 7 where the CPU 500 generates a data DA corresponding to the difference between $B_e$ and $K.B_g$ and sets again the proper aperture value of the stop 417. This operation calibrates the intensity of the e-line light against the intensity of the exposure g-line light.

At the next step 8, the CPU 500 generates an on/off signal ST and sub-shutter 628 is opened. Thus, the e-line light is projected to the projection lens system and about the same amount of light energy (thermal energy) as during the exposure period is supplied, thereby preventing any variation of the magnification. Then, at a step 9, a wafer coated with the photoresist is mounted on the two-dimensionally movable stage 420 of the exposure apparatus. Also, at the step 9, the stage 420 is moved so as to project a pattern image of the reticle in registration with the selected area of the wafer. Also, the CPU 500 sets in the register 506 the data DE corresponding to the required optimum exposure value for the wafer.

Figure 27:
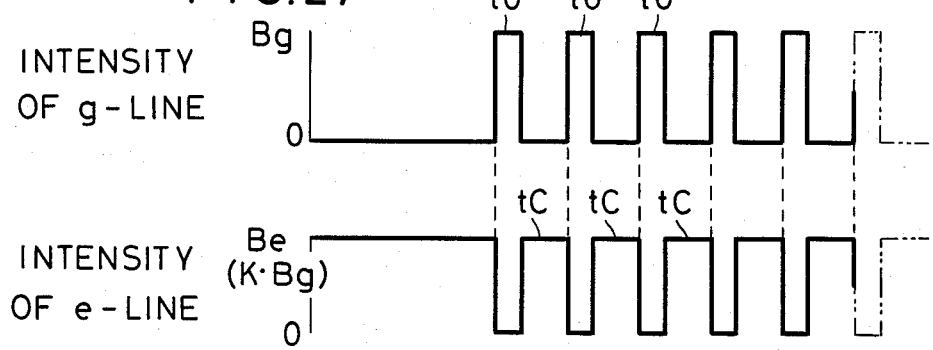
FIGS. 27 and 28 are respectively g-line and e-line light intensity distribution diagrams.

Then, at a step 10, the CPU 500 generates an on/off signal ST and closes the sub-shutter 628. At a step 11, the CPU 500 generates a start signal SS and opens the shutter 604. Thus, the pattern image of the reticle is projected onto the wafer. Then, at a step 12, a decision is made as to the generation of a coincidence signal SC so that if there is the coincidence signal SC, a transfer is made to a step 13 where the CPU 500 generates an on/off signal ST and the sub-shutter 628 is opened. Of course, the generation of the coincidence signal SC closes the shutter 608 by the operation of the driver circuit 508. Then, at a step 14, it is determined whether the exposure of the wafer has been repeated N times so that if it is, the exposure operation has ended completely. If the number of exposures made is less than N, a transfer is made to a step 15 so that the CPU 500 steps the stage 420 to the next exposure position and the operation is repeated starting at the step 10. During the interval of the steps 10 to 15, the g-line light and the line light are alternately turned on and off as shown in FIG. 27 and thus a predetermined light energy not varying with time is continuously projected to the reticle 7. In other words, the projection of the e-line light is interrupted during one exposure time $t_o$ by the g-line light and the e-line light is projected during the stepping time $t_c$ for the next exposure.

Figure 28:
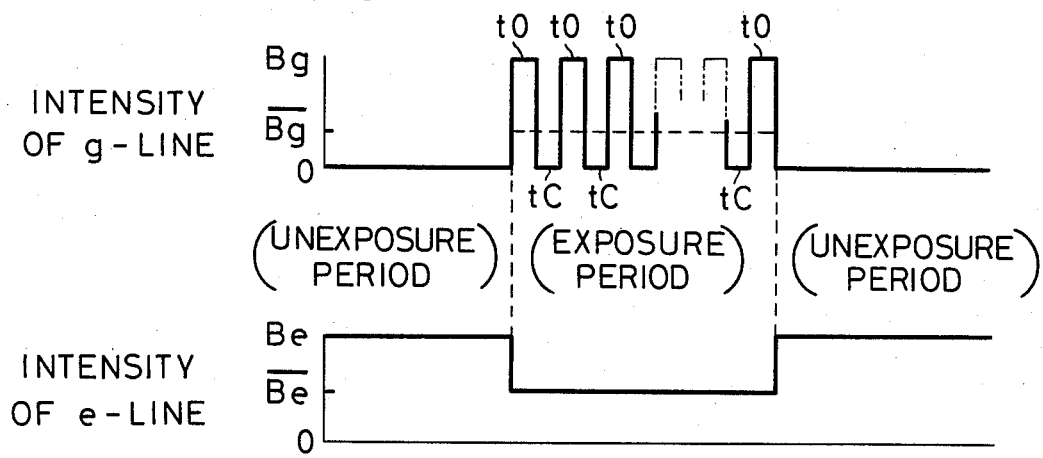

In the reduction projection exposure apparatus of the of the step and repeat type, the exposure is repeated several tens of times for each wafer. Where the time required for each step is 2 to 3 seconds, the e-line light need not be turned on and off repeatedly for each step. In other words, as shown in FIG. 28, the intensity of the e-line light is maintained at a predetermined value $\overline{B_e}$ during the exposure period of each wafer and the intensity of the e-line light is increased during the unexposure period following the completion of the exposure of the wafer, thereby controlling such that the average thermal energy of the g-line light and the e-line light passed through the projection lens system during the exposure period is substantially equal to the thermal energy of the e-line light passed through the projection lens system during the unexposure period. Thus, the energy absorbed by the projection lens system is always maintained constant thermally. It is to be noted that while the conditions of the unexposure period include, for example the time in which the reticle or wafer is aligned or the wafer or reticle change is made, during the reticle changing the e-line light is directly projected to the projection lens system without passing through the reticle and therefore the intensity of the e-line light must be decreased.

This operation will now be described in detail with reference to the flow chart shown in FIG. 29. Prior to the start of the exposure operation, the steps 1 to 8 of FIG. 26 are performed in the same manner to calibrate the intensity of the e-line light against the intensity of the g-line light. Thus, FIG. 29 represents the subsequent operations. After the step 8 of FIG. 26, the CPU 500 proceeds to a step 16 where the current aperture value of the stop 417 or an unexposure period aperture value $AV_1$ is stored in the memory.

Then, at a step 17, the CPU 500 calculate the intensity $\overline{B_e}$ of the e-line light to be projected during the exposure period in accordance with the exposure time $t_o$ and the stepping time $t_c$ for wafer exposure purposes and the intensity $B_g$ of the g-line light and the constant K which were previously obtained. This intensity $\overline{B_e}$ is calculated from the following equation $$\overline{B_e} = B_g \cdot \left( \frac{t_c}{t_o + t_c} \right)$$

This equation has the following significance. In other words, as shown in FIG. 10, during the exposure period of each wafer the average intensity $\overline{B_g}$ of the g-line light is given by $$\overline{B_g} = \frac{t_o}{t_o + t_c} \cdot B_g$$

in accordance with the duty ratio of the exposure time $t_o$ (the time in which the shutter 604 is opened) and the stepping time $t_c$. Then, assuming that the intensity $B_e$ of the e-line light projected during the unexposure period must be decreased to the intensity during the exposure period, the value of $(B_e - \overline{B_e})$ must be equal to the value of $K\overline{B_g}$. Thus, with $B_e\cdot\overline{B_e}=K.\overline{B_e}$, if it is set so that $\overline{B_e}=K.B_g$, then an equation $$\overline{B_e} = K \cdot B_g \cdot \left(\frac{t_c}{t_o + t_c}\right)$$

is obtained.

Then, the CPU 500 proceeds to a step 18 where the aperture value $AV_2$ of the stop 417 corresponding to the intensity $B_e$ is calculated and stored in the memory. At a step 19, the wafer is set in the apparatus in the same manner as the step 9 of FIG. 26 and the data DE corresponding to the exposure time $t_o$ is set in the register 506. Then, at a step 20, the CPU 500 generates the data DA corresponding to the previously stored aperture value AV and the aperture value of the stop 417 is set. Then, after the shutter 604 has been opened at a step 21 and the closure of the shutter 604 has been detected, whether the wafer has been exposed N times is determined at a step 23 so that if it has not, the stage 420 is moved by one step at a step 24. When the exposure of the single wafer has been completed in this way, at a step 25 the CPU 500 generates the data DA corresponding to the previously stored aperture value $AV_1$ and the aperture value of the stop 417 is restored to the initial value thereby projecting the e-line light of the intensity $B_e$.

Then, at a step 26, whether the next wafer is to be exposed continuously is determined so that if it is not, the processing is ended. If the next wafer is to be exposed, a transfer is made to a step 27 and a decision is made as to whether the duty ratio of the exposure time $t_o$ and the stepping time $t_c$ is to be changed. If the duty ratio is not to be changed, a return is made to the step 19 and the wafer is exposed again in a similar sequence. If the duty ratio is to be changed, a return is made to the step 17 and the processing is performed repeatedly starting from the calculation of the intensity $B_e$ of the e-line light which is to be projected during the exposure period.

Where the same exposure time $t_o$ and stepping time $t_c$ are used for all of the wafers to be exposed by the exposure apparatus, the same effect can be obtained by arranging such that the intensity of the e-line light is set to $B_e$ from the first during the unexposure period and the projection of the e-line light is blocked by the subshutter 628 during the exposure period of each wafer. In this case, however, the intensity $\overline{B_e}$ must be set to $$\overline{B_e} = K \cdot \overline{B_g} = K \cdot B_g \frac{t_o}{t_o + t_c}$$

Figure 30:
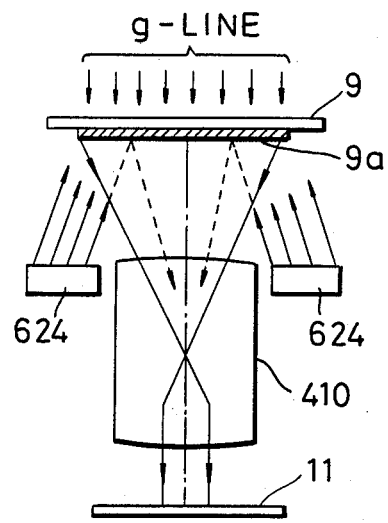
FIG. 30 is a diagram showing the construction of a part of an eighth embodiment of the invention.

Also, the light source 1 is designed to produce both the g-line light and the e-line light in the above-mentioned embodiments. Thus, the intensities themselves of the g-line light and the e-line light cannot be varied separately. In other words, while the intensity of the e-line light can be decreased as compared with the g-line light forming the exposure light by means of the stop 417, it is impossible to increase the intensity. Of course, a stop of some type may be placed in the optical path of the g-line light to increase the intensity. This decreases the illuminance of the exposure light and the exposure time t is increased, thereby causing a decrease in the throughput. Thus, a separate light source may be provided in addition to the light source 1 so that the e-line light from this light source is projected to the projection lens system through for example, the optical unit 619 of FIG. 25. In this case, while it is desirable that the intensity of the e-line light from the separate light source is be greater than the e-line light from the light source 1, this is not necessary. In other words, if it is arranged so that the e-line light from the light source 1 and e-line light from the separate light source are combined and emitted through the optical unit 619, it is only necessary to prepare the separate light source which generates the light intensity corresponding to that which is to be increased. In addition, the optical illuminating means formed by the combination of the separate light source and the optical unit 619 need not be arranged above the reticle, that is, it is not limited to such a position that the e-line light illuminates the reticle from the same direction as the g-line light illuminates the reticle. For example, as shown in FIG. 30, light sources 624, adapted to vary the intensity of the e-line light or adapted to be turned on and off in response to the opening and closing of the shutter 604, are disposed on the back side of the reticle 9 so as to project. The e-line light from the light source 624 on a pattern layer 9a of chromium on the back side of the reticle 9. The e-line light projected from the light sources 624 is reflected and projected to the projection lens system 410, thereby maintaining constant the magnification of the projection lens system 410.

The wavelengths of the exposure light and the unexposure light are not limited to the g-line and e-line, respectively. For example, light which does not sensitize a photosensitive material, e.g., infrared radiation, is longer in wavelength than the g-line and also it has a large thermal energy which contributes to raise the temperature of the material. Thus, such light is suitable for the purpose of thermally stabilizing the projection lens system.

Further, while a mercury-vapor lamp is used for the light source in the above-mentioned embodiments, if the pattern is illuminated by means of the pulsed laser beam from a high-power laser oscillator, there is no need to use the previously mentioned shutters 404 and 604. For this purpose, it is only necessary to ensure the excitation of one to several pulses of laser beam for each exposure and therefore means for determining the number of pulses, the excitation timing, etc., functions as switching means for making the switching between the exposure condition and the unexposure condition.

Still further, the same effect can be obtained by using the pulsed laser beam for the light of unexposure wavelength. Also, in this case, the magnification can be maintained constant during the unexposure period by controlling the number of pulses and the pulse interval. Still further, the same effect can be obtained by providing between the reticle 9 and the projection lens system 410 a dichroic mirror or the like which reflects and projects the light of unexposure wavelength to the projection lens system.

We claim:

1. In a projection exposure apparatus in which an image of a photographic mask is formed on a substrate by using a projection optical system arranged between the photographic mask and the substrate, the method of controlling the incidence of light energy to the projection optical system comprising the steps of:
   (a) calculating the amount of light energy incident per unit time to said projection optical system during exposure of said substrate and (b) projecting, after the completion of said exposure of said substrate, substantially the same amount of light energy as said incident light energy unit time to said projection optical system at intervals of said unit time.

2. A method according to claim 1, wherein said projection exposure apparatus comprises shutter means adapted to be opened to enable the incidence of light energy to said projection optical system, and wherein said projecting step includes a step of closing said shutter means and a step of opening said shutter means during a time interval between the completion of said exposure of said substrate and the expiration of a first unit time.

3. A method of claim 1, wherein said projection exposure apparatus comprises a light source for supplying light energy of a predetermined intensity, and shutter means arranged between said light source and said projection optical system, and wherein said calculating step includes a step of determining a time t during which said shutter means is opened and said substrate is exposed in said unit time.

4. A method according to claim 3, wherein with said unit time being represented by T, said projecting step comprises a step of closing said shutter means for a predetermined time T-t from the completion of said exposure of said substrate to disable the incidence of said light energy to said projection optical system, and a step of opening said shutter means until said time t expires after the expiration of said predetermined time T-t to enable the incidence of said light energy to said projection optical system.

5. A method according to claim 3, wherein said projecting step comprises:
a first projecting step of opening said shutter means for said determined time t from the completion of said exposure of said substrate to enable the incidence of said light energy to said projection optical system;
a step of closing said shutter means for a first predetermined time longer than time T-t in succession to said first projecting step to disable the incidence of said light energy to said projection optical system, said T representing said unit time; and
a step of opening said shutter means for a second predetermined time subsequent to said disabling step.

6. A method according to cliam 3, further comprising a step of opening said shutter means for a time longer than said determined time t prior to said projecting step to enable the incidence of said light energy to said projection optical system.

7. A method according to claim 1, wherein said projection exposure apparatus comprises a light source for supplying light energy of a predetermined intensity, and shutter means arranged between said light source and said projection optical system, and wherein said calculating step comprises a step of determining a proportion of a time during which said shutter means is opened and said substrate is exposed in said unit time.

8. A method according to claim 1, wherein said projection exposure apparatus further comprises a stage adapted to be illuminated by said light energy passed through said projection optical system, and wherein said method further comprises the steps of:
positioning said substrate on said stage, said shutter means being closed to disable the incidence of said light energy to said projection optical system during said positioning:
removing said substrate from said stage when a time required for said positioning of said substrate exceeds a predetermined time; and
opening said shutter means for a time corresponding to said determined time proportion to said time during which said shutter means is closed for said postioning of said substrate.

9. In a projection exposure apparatus including an optical system for projecting an image of a photographic mask on a substrate, a system for controlling the incidence of light energy to said optical system comprising:
(a) means for switching an optical relation between said substrate and said optical system between an operating state involving exposure of said substrate to said light energy and a rest state not involving said exposure; and
(b) means whereby an amount of light energy corresponding to the amount of light energy incident to said optical system during a unit time in said operating state is projected to said optical system during said unit time in said rest state.

10. In a projection exposure apparatus including an optical system for projecting an image of a photographic mask on a substrate, a system for controlling the incidence of light energy to said optical system comprising:
(a) means for switching an optical relation between said substrate and said optical system between an operating state involving exposure of said subtrate to said light energy and a rest state not involving said exposure; and
(b) means whereby in accordance with the ratio between a first time involving the incidence of said light energy to said optical system and a second time not involving said incidence during a unit time in said operating state, a desired amount of light energy is projected to said optical system during said unit time in said rest state.

11. A projection exposure apparatus comprising:
(a) first irradiation means for emitting light energy of a predetermined wavelength;
(b) a projection optical system for projecting said light energy to form an image of a photomask on a photosensitive material;
(c) switching means for effecting switching between an exposure state enabling the incidence of light energy to said projection optical system and an unexposure state disabling the incidence of light energy to said projection optical system; and
(d) second irradiation means for projecting light energy of a wavelength other than said predetermined wavelength to said projection optical system such that said projection optical system has substantially the same optical characteristics in said exposure state and said unexposure state, respectively.

12. An apparatus according to claim 5, wherein said switching means includes a shutter for passing and blocking said light energy of said predetermined wavelength, and wherein said shutter includes a reflecting surface on the back of a side thereof to which said light energy of said predetermined wavelength is incident whereby said light energy from said second irradiation means is projected to said projection optical system by said reflecting surface in said unexposure state.

13. An apparatus according to claim 5, further comprising light source means for emitting said light energy of said predetermined wavelength and said light energy of said wavelength other than said predetermined wavelength, and wherein said first irradiation means includes first optical means for extracting said light energy of said predetermined wavelength from said light source means and directing the same to said projection optical system and said second irradiation means includes second optical means for directing said light energy of said wavelength other than said predetermined wavelength from said light source means to said projection optical system.

14. An apparatus according to claim 5, further comprising means for radiating an energy beam including at least said light energy of said predetermined wavelength and said light energy of said wavelength other than said predetermined wavelength, wherein said first irradiation means includes first extracting means for extracting said light energy of said predetermined wavelength from said energy beam radiated from said radiating means, and wherein said second irradiation means includes second extracting means for extracting said light energy of said wavelength other than said predetermined wavelength from said energy beam radiated from said radiating means.

15. An apparatus according to claim 8, wherein each of said first and second extracting means includes a dichroic mirror.

16. An apparatus according to claim 8, wherein one of said first and second extracting means is arranged in series with said radiating means so as to receive said energy beam passed through the other of said first and second extracting means.

17. A projection exposure apparatus comprising:
means for emitting light energy;
a projection optical system for projecting said light energy so as to form an image of a photographic mask on a substrate;
means for switching an optical relation between said substrate and said projection optical system between an operating state involving exposure of said substrate to said light energy with said substrate placed on a path of projection light radiated from said projection optical system and a rest state not involving said exposure with said substrate removed from said projection light path;
means whereby an amount of light energy corresponding to the amount of light energy incident to said projection optical system during a unit time in said operating state is projected to said projection optical system during said unit time in said rest state; and
blocking means arranged to block the passage of said light energy radiated from said projection optical system during said rest state.

18. An apparatus according to claim 11, wherein said switching means comprises stage means adapted to make, with said substrate mounted thereon, a two-dimensional movement within a plane perpendicular to said projection light path, and wherein said substrate is removed from said projection light path by said stage means during said rest period.

19. An apparatus according to claim 12, wherein said blocking means is inserted in said projection light path by said stage means.

20. An apparatus according to claim 13, wherein said blocking means comprises means arranged on said stage means in a thermally independent relation therewith.

* * * * *